(12) United States Patent
Yu et al.

(10) Patent No.: US 12,159,860 B2
(45) Date of Patent: *Dec. 3, 2024

(54) SINGULATION AND BONDING METHODS AND STRUCTURES FORMED THEREBY

(71) Applicant: Taiwan Semiconductor Manufacturing Co., Ltd., Hsinchu (TW)

(72) Inventors: Chen-Hua Yu, Hsinchu (TW); Tsang-Jiuh Wu, Hsinchu (TW); Wen-Chih Chiou, Zhunan Township (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 11 days.

This patent is subject to a terminal disclaimer.

(21) Appl. No.: 17/833,100

(22) Filed: Jun. 6, 2022

(65) Prior Publication Data

US 2022/0310565 A1    Sep. 29, 2022

Related U.S. Application Data

(60) Continuation of application No. 16/046,285, filed on Jul. 26, 2018, now Pat. No. 11,355,475, which is a
(Continued)

(51) Int. Cl.
*H01L 23/538*    (2006.01)
*H01L 21/56*    (2006.01)
(Continued)

(52) U.S. Cl.
CPC ........ *H01L 25/0657* (2013.01); *H01L 21/561* (2013.01); *H01L 21/78* (2013.01);
(Continued)

(58) Field of Classification Search
CPC ... H01L 25/0657; H01L 21/561; H01L 21/78; H01L 23/3114; H01L 25/50;
(Continued)

(56) References Cited

U.S. PATENT DOCUMENTS 6,649,445 B1    11/2003    Qi et al.
6,908,784 B1    6/2005    Farnworth et al.
(Continued)

FOREIGN PATENT DOCUMENTS

CN    103383923 A    11/2013
CN    105023917 A    11/2015
(Continued)

*Primary Examiner* — Samuel Park
(74) *Attorney, Agent, or Firm* — Slater Matsil, LLP

(57) ABSTRACT

Methods of singulation and bonding, as well as structures formed thereby, are disclosed. A method includes singulating a first chip and after the singulating the first chip, bonding the first chip to a second chip. The first chip includes a first semiconductor substrate and a first interconnect structure on a front side of the first semiconductor substrate. The singulating the first chip includes etching through a back side of the first semiconductor substrate through the first interconnect structure.

20 Claims, 36 Drawing Sheets

Related U.S. Application Data division of application No. 14/950,915, filed on Nov. 24, 2015, now Pat. No. 11,037,904.

(51) Int. Cl.
| | |
|---|---|
| *H01L 21/78* | (2006.01) |
| *H01L 23/31* | (2006.01) |
| *H01L 25/00* | (2006.01) |
| *H01L 25/065* | (2023.01) |
| *H01L 21/768* | (2006.01) |

(52) U.S. Cl.
CPC .......... *H01L 23/3114* (2013.01); *H01L 25/50* (2013.01); *H01L 21/568* (2013.01); *H01L 21/76898* (2013.01); *H01L 2224/11* (2013.01); *H01L 2225/06513* (2013.01); *H01L 2225/06527* (2013.01); *H01L 2225/06541* (2013.01); *H01L 2225/06548* (2013.01); *H01L 2225/06555* (2013.01)

(58) Field of Classification Search
CPC ............. H01L 21/568; H01L 21/76898; H01L 2224/11; H01L 2225/06513; H01L 2225/06527; H01L 2225/06541; H01L 2225/06548; H01L 2225/06555; H01L 21/187; H01L 23/525; H01L 25/071
See application file for complete search history.

(56) References Cited

U.S. PATENT DOCUMENTS

| | | | |
|---|---|---|---|
| 7,199,449 B2 | 4/2007 | Lake | |
| 7,894,199 B1 | 2/2011 | Chang | |
| 8,058,150 B2 | 11/2011 | Wu et al. | |
| 2002/0158345 A1 | 10/2002 | Hedler et al. | |
| 2003/0062613 A1 | 4/2003 | Masumoto et al. | |
| 2004/0142509 A1* | 7/2004 | Imai ................... | H01L 25/0657 257/E23.125 |
| 2004/0251525 A1* | 12/2004 | Zilber ................. | H01L 23/3114 257/E23.021 |
| 2005/0001329 A1 | 1/2005 | Matsuki et al. | |
| 2006/0068567 A1 | 3/2006 | Beyne et al. | |
| 2006/0079072 A1 | 4/2006 | David et al. | |
| 2007/0012655 A1 | 1/2007 | Kwon et al. | |
| 2007/0126085 A1* | 6/2007 | Kawano ............ | H01L 21/76898 257/E21.705 |
| 2008/0006900 A1 | 1/2008 | Chan et al. | |
| 2008/0316714 A1 | 12/2008 | Eichelberger et al. | |
| 2009/0309235 A1 | 12/2009 | Suthiwongsunthom et al. | |
| 2009/0316378 A1* | 12/2009 | Haba ..................... | H01L 25/105 29/840 |
| 2010/0065949 A1* | 3/2010 | Thies ................ | H01L 21/76898 438/109 |
| 2010/0078407 A1 | 4/2010 | Lebens et al. | |
| 2010/0233867 A1 | 9/2010 | Akiyama et al. | |
| 2010/0270668 A1 | 10/2010 | Marcoux | |
| 2011/0033978 A1 | 2/2011 | Oh | |
| 2011/0049695 A1 | 3/2011 | Shin et al. | |
| 2011/0062564 A1* | 3/2011 | Gruenhagen ..... | H01L 23/49506 438/118 |
| 2011/0068459 A1 | 3/2011 | Pagaila et al. | |
| 2011/0193221 A1 | 8/2011 | Hu et al. | |
| 2011/0233706 A1 | 9/2011 | Hong et al. | |
| 2012/0184083 A1* | 7/2012 | Shimoyama ........ | H01L 29/0661 438/433 |
| 2013/0134588 A1 | 5/2013 | Yu et al. | |
| 2013/0178062 A1 | 7/2013 | Enquist et al. | |
| 2013/0214410 A1 | 8/2013 | Khan et al. | |
| 2013/0234322 A1 | 9/2013 | Pendse | |
| 2014/0001612 A1 | 1/2014 | Yu et al. | |
| 2014/0138833 A1* | 5/2014 | Seng ..................... | H01L 24/05 257/751 |
| 2014/0217617 A1 | 8/2014 | Haba et al. | |
| 2014/0252594 A1 | 9/2014 | Meng et al. | |
| 2014/0291825 A1 | 10/2014 | Yoneyama et al. | |
| 2014/0339708 A1 | 11/2014 | Jang et al. | |
| 2014/0361427 A1 | 12/2014 | Kim | |
| 2015/0084206 A1 | 3/2015 | Lin | |
| 2015/0279739 A1 | 10/2015 | Lei et al. | |
| 2015/0318246 A1 | 11/2015 | Yu et al. | |
| 2015/0318264 A1 | 11/2015 | Yu et al. | |

FOREIGN PATENT DOCUMENTS

| | | |
|---|---|---|
| CN | 105047620 A | 11/2015 |
| KR | 20080039899 A | 5/2008 |
| TW | 201342581 A | 10/2013 |
| TW | 201448166 A | 12/2014 |
| WO | 03030254 A2 | 4/2003 |
| WO | 2008002790 A1 | 1/2008 |

\* cited by examiner

SINGULATION AND BONDING METHODS AND STRUCTURES FORMED THEREBY

PRIORITY CLAIM AND CROSS-REFERENCE

This application is a continuation of U.S. application Ser. No. 16/046,285, entitled "Singulation and Bonding Methods and Structures Formed Thereby," filed on Jul. 26, 2018, which is a divisional of U.S. application Ser. No. 14/950,915, entitled "Singulation and Bonding Methods and Structures Formed Thereby," filed on Nov. 24, 2015, now U.S. Pat. No. 11,037,904, issued Jun. 15, 2021, which applications are hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers may be bonded together through suitable bonding techniques. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
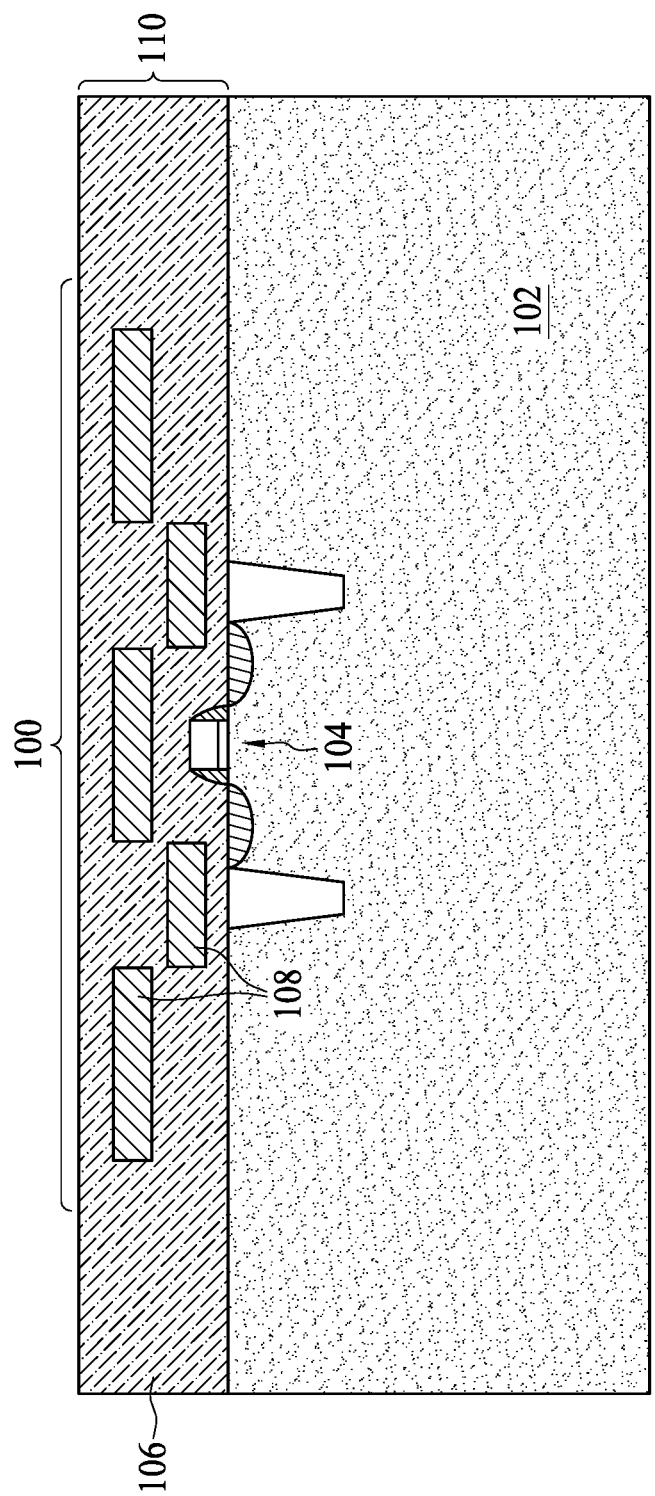
FIGS. 1 through 8 are various cross-sectional views of structures in intermediate steps of a first embodiment wherein a chip is singulated and bonded to a larger substrate.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein are discussed in the context of various singulation, and bonding a chip (and/or chip stack) to a wafer. One of ordinary skill in the art will readily understand that various aspects of embodiments discussed herein can be applied to other contexts, such as chip-to-chip bonding and wafer-to-wafer bonding. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

FIGS. 1 through 8 illustrate various cross-sectional views of structures in intermediate steps of a first embodiment wherein a chip is singulated and bonded to a larger substrate, e.g., a wafer. Referring first to FIG. 1, a first integrated circuit chip (or more simply, "chip") 100 is shown prior to a singulation. The first chip 100 includes a first semiconductor substrate 102 having a first electrical circuit (illustrated by first electrical circuitry including first transistors 104) formed thereon. The first semiconductor substrate 102 may comprise, for example, a bulk semiconductor, a semiconductor-on-insulator (SOI) substrate, or the like. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. The semiconductor material of the first semiconductor substrate 102 may include elemental semiconductor such as silicon, germanium, or the like; a compound or alloy semiconductor including SiC, SiGe, GaAs, GaP, InP, InAs, InSb, GaAsP, AlInAs, AlGaAs, GaInAs, GaInP, GaInAsP, or the like; or a combination thereof. As illustrated in FIG. 1, the first semiconductor substrate 102 is part of a larger semiconductor substrate, such as a wafer, with other similar or same chips formed thereon before singulation.

In an embodiment, the circuitry includes electrical devices, such as first transistor 104, formed on the first semiconductor substrate 102 with one or more dielectric layer(s) 106 with a respective metallization pattern 108 overlying the electrical devices. The electrical devices, such as first transistor 104, may be formed on what can be referred to as the front side of the first semiconductor substrate 102. The side of the first semiconductor substrate 102 opposite from the front side of the first semiconductor substrate 102 may be referred to as the back side of the first semiconductor substrate 102. The metallization patterns 108 in the dielectric layer(s) 106 (e.g., formed on the front side of the first semiconductor substrate 102) may route electrical signals between the electrical devices and/or to nodes external to the first semiconductor substrate 102. Electrical devices may also be formed in one or more dielectric layer(s) 106. For ease of reference subsequently, the dielectric layer(s) 106 and metallization patterns 108, with any contacts and/or vias, are collectively referred to as a first chip front side interconnect structure 110.

The first electrical circuitry formed on the first semiconductor substrate 102 may be any type of circuitry suitable for a particular application. For example, the first electrical circuitry may include various devices, such as transistors, capacitors, resistors, diodes, photo-diodes, fuses, and the like, interconnected to perform one or more functions. The first electrical circuitry may include memory structures, data processing structures, sensors, amplifiers, power distribution, input/output circuitry, or the like. An example illustrated in FIG. 1 shows first transistors 104 in the first semiconductor substrate 102. Each first transistor 104 comprises source/drain regions in an active region of the first semiconductor substrate 102, where the active regions are defined by isolation regions, such as shallow trench isolations (STIs), in the first semiconductor substrate 102. Each first transistor 104 further comprises a gate structure on the first semiconductor substrate 102 disposed between respective source/drain regions. The gate structure comprises a gate dielectric on the first semiconductor substrate 102, a gate electrode on the gate dielectric, and gate spacers on opposing lateral sides of the gate dielectric and gate electrode. One of ordinary skill in the art will appreciate that the above examples are provided for illustrative purposes. Other circuitry may be used as appropriate for a given application.

The dielectric layer(s) 106 can include one or more inter-layer dielectric (ILD) layer and one or more inter-metallization dielectric (IMD) layer. The dielectric layer(s) 106 may be formed, for example, of a low-K dielectric material, such as phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that any number of dielectric layers 106 may be formed in the first chip front side interconnect structure 110.

Although not specifically illustrated, contacts can be formed through one or more of the dielectric layer(s) 106, such as through the ILD layer, to provide an electrical contact to the first transistors 104, such as to the source/drain regions of the first transistors 104. The contacts may be formed, for example, by using photolithography techniques to deposit and pattern a photoresist material on the ILD layer to expose portions of the ILD layer that are to become the contacts. An etch process, such as an anisotropic dry etch process, may be used to create openings in the ILD layer. The openings may be lined with a diffusion barrier layer and/or an adhesion layer (not shown), and filled with a conductive material. The diffusion barrier layer may comprise one or more layers of TaN, Ta, TiN, Ti, cobalt tungsten, or the like, and the conductive material may comprise copper, tungsten, aluminum, silver, and combinations thereof, or the like, thereby forming the contacts.

Similarly, a metallization pattern 108, which may include vias to an underlying metallization pattern, can be formed in the dielectric layer(s) 106, such as an IMD layer. The metallization patterns 108 may be formed, for example, by using photolithography techniques to deposit and pattern a photoresist material on the respective IMD layer to expose portions of the IMD layer that are to become the respective metallization pattern 108. An etch process, such as an anisotropic dry etch process, may be used to create recesses/openings in the IMD layer. The recesses/openings may be lined with a diffusion barrier layer and/or an adhesion layer (not shown), and filled with a conductive material. The diffusion barrier layer may comprise one or more layers of TaN, Ta, TiN, Ti, cobalt tungsten, or the like, and the conductive material may comprise copper, tungsten, aluminum, silver, and combinations thereof, or the like, thereby forming the metallization patterns 108 as illustrated in FIG. 1. Generally, the dielectric layer(s) 106, such as the ILD layer and IMD layers, and the associated metallization patterns 108 are used to interconnect the electrical circuitry and to provide an external electrical connection.

It should also be noted that the dielectric layer(s) 106 may further include one or more etch stop layer positioned between adjacent ones of the ILD and IMD layers. Generally, the etch stop layers provide a mechanism to stop an etching process when forming vias and/or contacts. The etch stop layers are formed of a dielectric material having a different etch selectivity from adjacent layers, e.g., an etch stop layer between the underlying first semiconductor substrate 102 and the overlying ILD layer. In an embodiment, etch stop layers may be formed of SiN, SiCN, SiCO, CN, combinations thereof, or the like, deposited by CVD or PECVD techniques.

Figure 2:
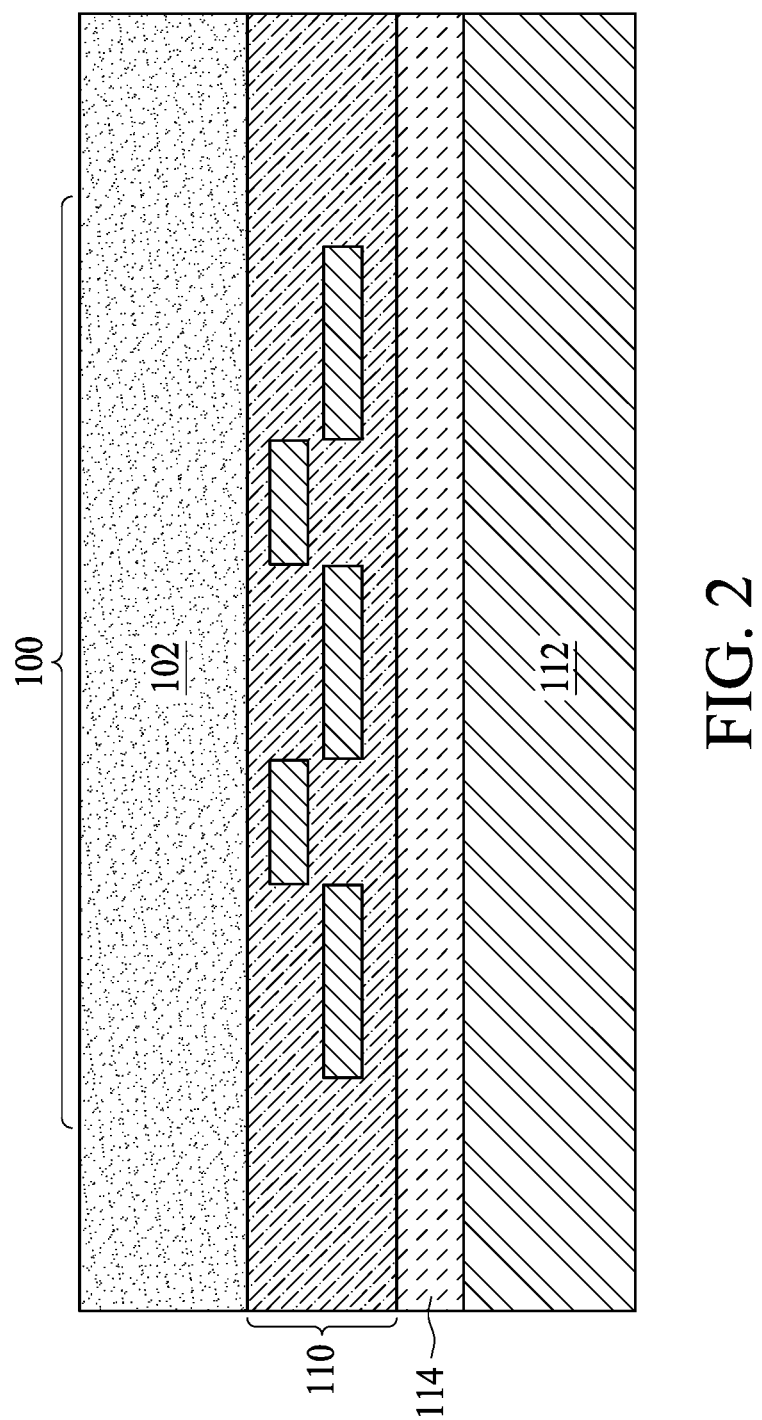

With reference to FIG. 2, the first chip 100, as part of the larger substrate, is adhered to a carrier substrate 112 by a release layer 114. The release layer 114 adheres the first chip front side interconnect structure 110 of the first chip 100 to the carrier substrate 112. The carrier substrate 112 may be a glass carrier substrate, a ceramic carrier substrate, or the like. The carrier substrate 112 may further be a larger substrate, e.g., a wafer. The release layer 114 may be formed of a polymer-based material, which may be removed along with the carrier substrate 112 from the first chip 100 (and other chips) after singulation of the first chip 100. In some embodiments, the release layer 114 is an epoxy-based thermal-release material, which loses its adhesive property when heated, such as a Light-to-Heat-Conversion (LTHC) release coating. In other embodiments, the release layer 114 may be an ultra-violet (UV) glue, which loses its adhesive property when exposed to UV lights. The release layer 114 may be dispensed as a liquid and cured, may be a laminate film laminated onto the carrier substrate 112, or may be the like.

Once the first chip 100, as part of the larger substrate, is adhered to the carrier substrate 112, the first semiconductor substrate 102 may be thinned. The thinning process can thin the first semiconductor substrate 102 from the back side of the first semiconductor substrate 102. The thinning process can include a grinding process such as a Chemical Mechanical Polishing (CMP), an etch-back process, the like, or a combination thereof. In some embodiments, before thinning the first semiconductor substrate 102, the thickness of the first chip 100 (e.g., a combined thickness of the first semiconductor substrate 102 and the first chip front side interconnect structure 110) can be approximately 300 μm or greater, and after thinning the first semiconductor substrate 102, the thickness can be approximately 5 μm or greater, for example, between about 5 μm and about 20 μm.

Figure 3:
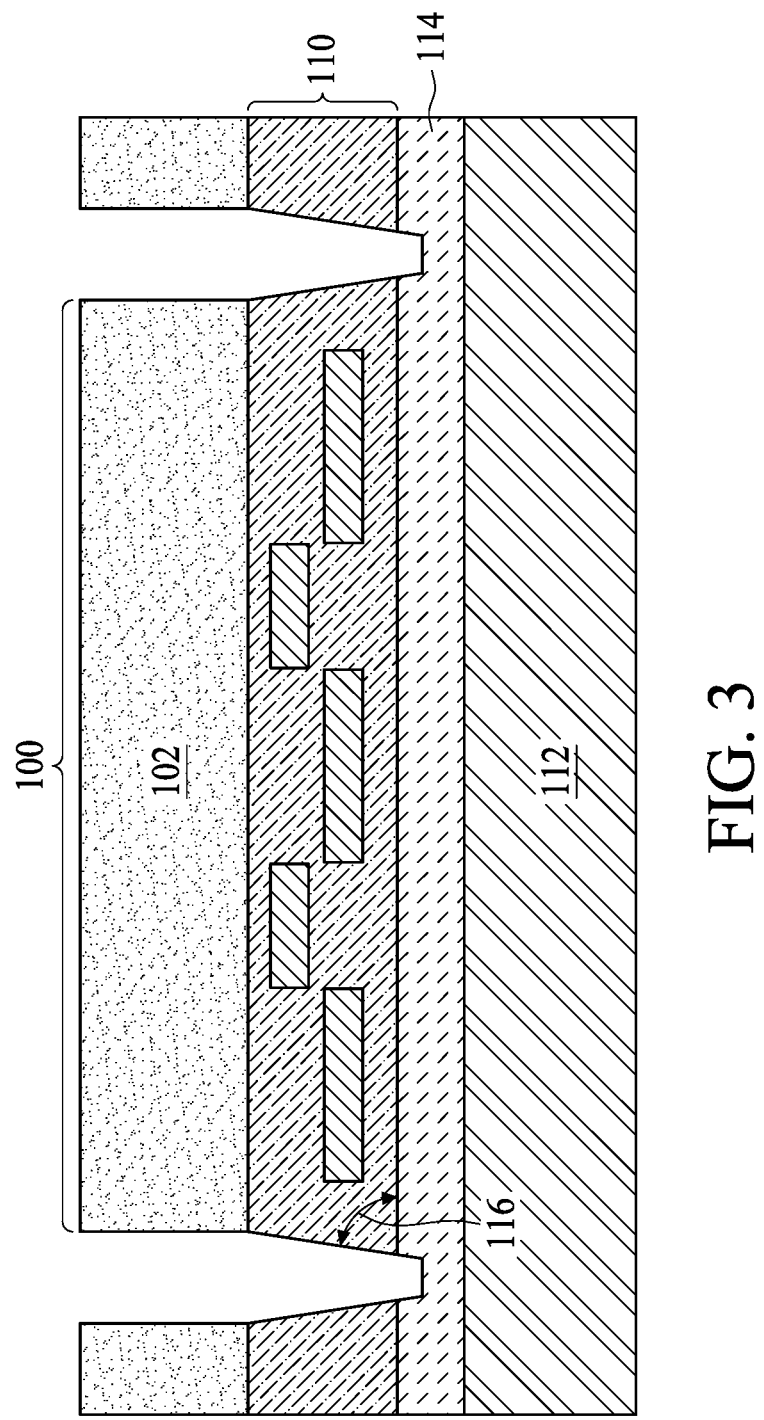

With reference to FIG. 3, while the first chip 100, as part of the larger substrate, is adhered to the carrier substrate 112, an etch singulation process is performed through the back side of the first semiconductor substrate 102 to singulate the first chip 100 from the larger substrate and/or other chips. The etch singulation process can use photolithography and etching techniques. The etch singulation process can include depositing, exposing to light, and developing a photoresist on the back side of the first semiconductor substrate 102. This process patterns the photoresist on the back side of the first semiconductor substrate 102. The pattern formed in the photoresist exposes singulation regions at the periphery of the first chip 100 that are to be etched to thereby singulate the first chip 100 and/or similar chips from the larger substrate. An etch process can then be performed through the patterned photoresist. The etch process can be anisotropic, such as a Deep Reactive Ion Etch (DRIE), an Inductively Coupled Plasma (ICP) etch, a Capacitively Coupled Plasma (CCP) etch, the like, or a combination thereof. The etch process etches through the singulation regions through the first semiconductor substrate 102 and the first chip front side interconnect structure 110. After the etch process is completed, the first chip 100 and/or other similar chips are singulated. Various layers may be present on the back side of the first semiconductor substrate 102 during the etch process, such as hardmask layer(s), anti-reflection coating (ARC) layer(s), the like, or a combination thereof.

The etch process can result in sidewalls of the first chip 100 that are vertical, non-vertical, or a combination thereof. For example, a sidewall of the first chip 100 proximate the back side of the first semiconductor substrate 102 can be vertical, while a sidewall of the first chip 100 proximate and/or on the first chip front side interconnect structure 110 can be non-vertical. As illustrated a sidewall of the first chip front side interconnect structure 110 of the first chip 100 is non-vertical. An interior angle 116 between the sidewall of the first chip front side interconnect structure 110 of the first chip 100 and an exterior surface of the first chip front side interconnect structure 110 of the first chip 100 distal from the first semiconductor substrate 102 is less than 90°, which interior angle 116 may further be between about 89° and about 60°, and more particularly, may be between about 88° and about 80°.

The etch singulation process discussed with respect to FIG. 3 can allow for more flexibility of a layout shape of the first chip 100. For example, including allowing for a rectangular layout shape of the first chip 100, a layout shape of the first chip 100 could be hexagonal, octagonal, circular, ovaloid, another polygonal shape, or the like.

Figure 4:
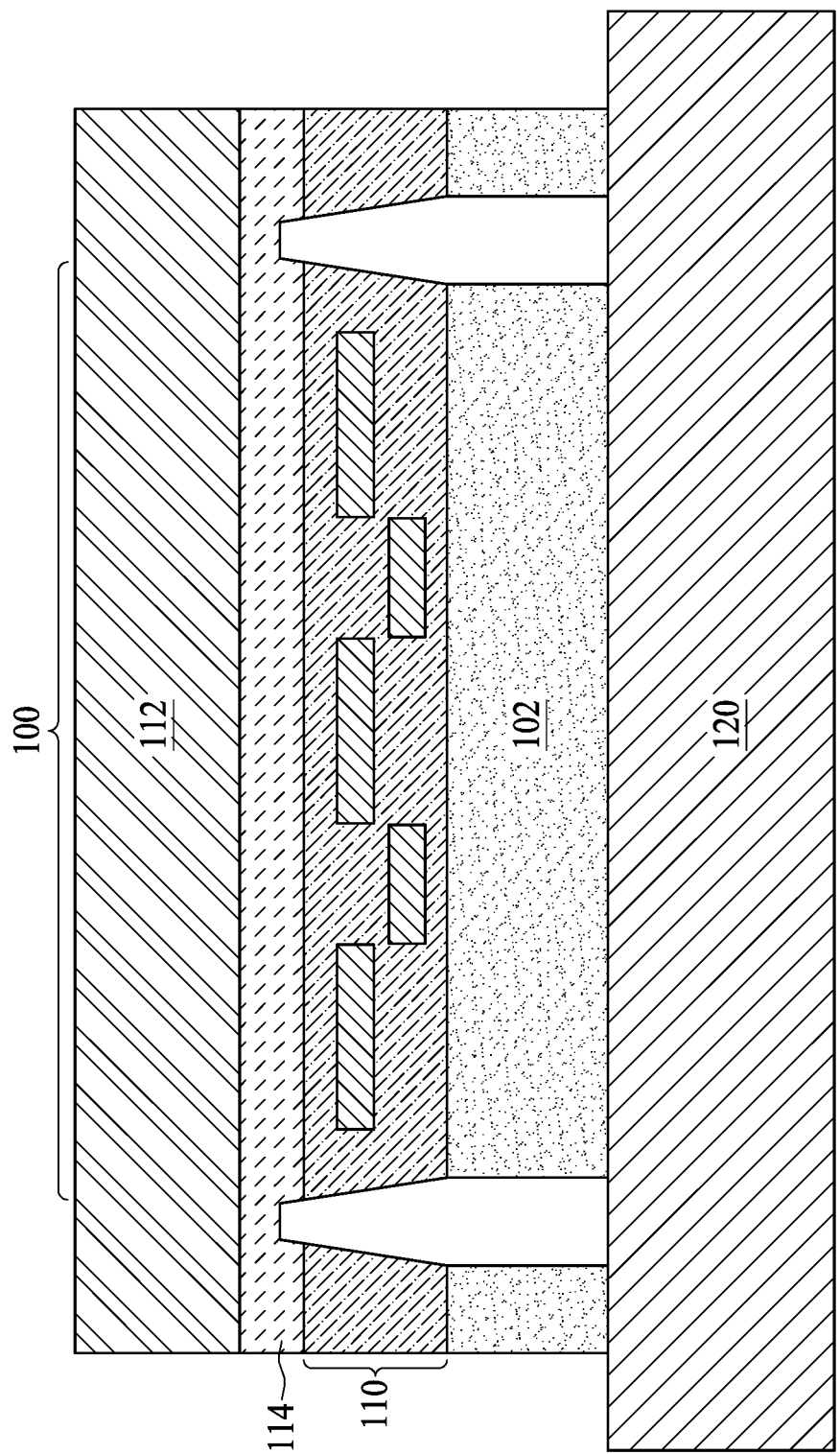
Figure 5:
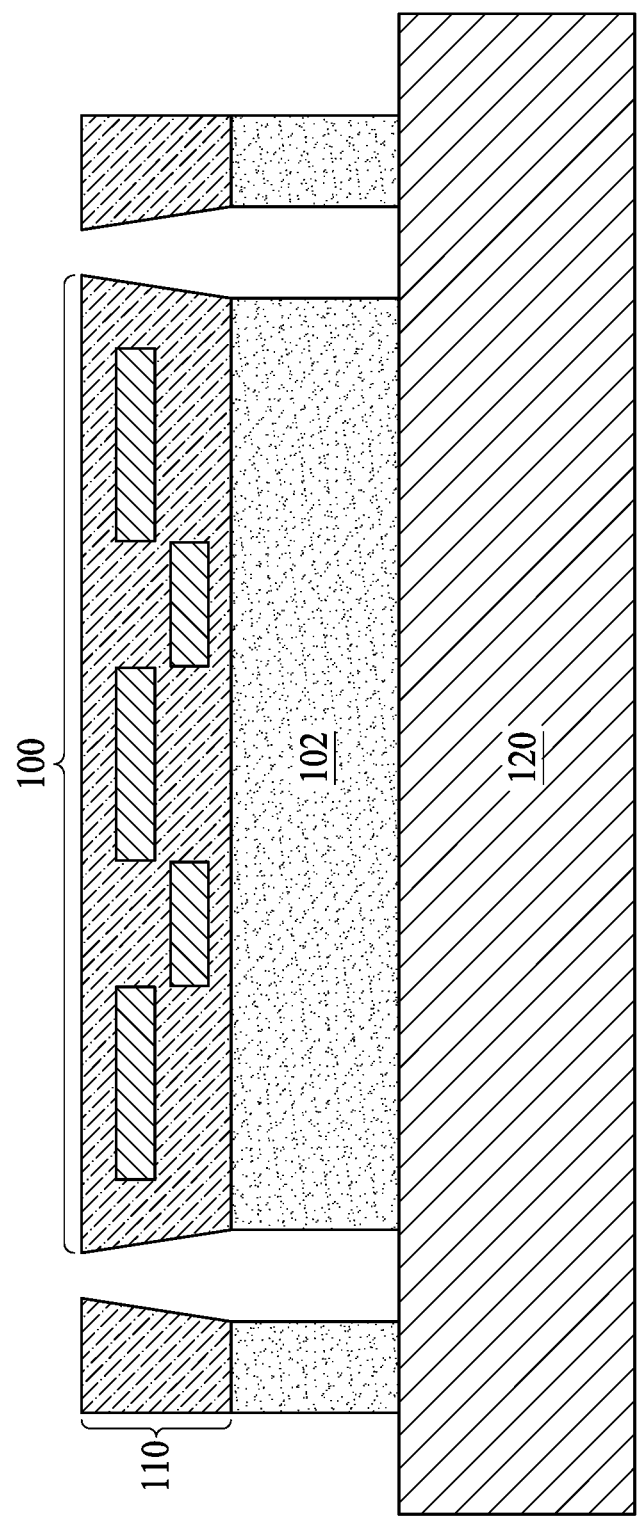

Referring to FIG. 4, the singulated first chip 100, while still adhered to the carrier substrate 112, is flipped over and attached to a dicing tape 120. With reference to FIG. 5, a carrier substrate detach process is performed to detach the carrier substrate 112 from the first chip 100, e.g., from the first chip front side interconnect structure 110. In accordance with some embodiments, the de-bonding includes projecting a light such as a laser light or an UV light on the release layer 114 so that the release layer 114 decomposes and the carrier substrate 112 can be removed. A cleaning process may be performed to remove residue of the release layer 114 remaining on the first chip 100 after the detach process.

Figure 6:
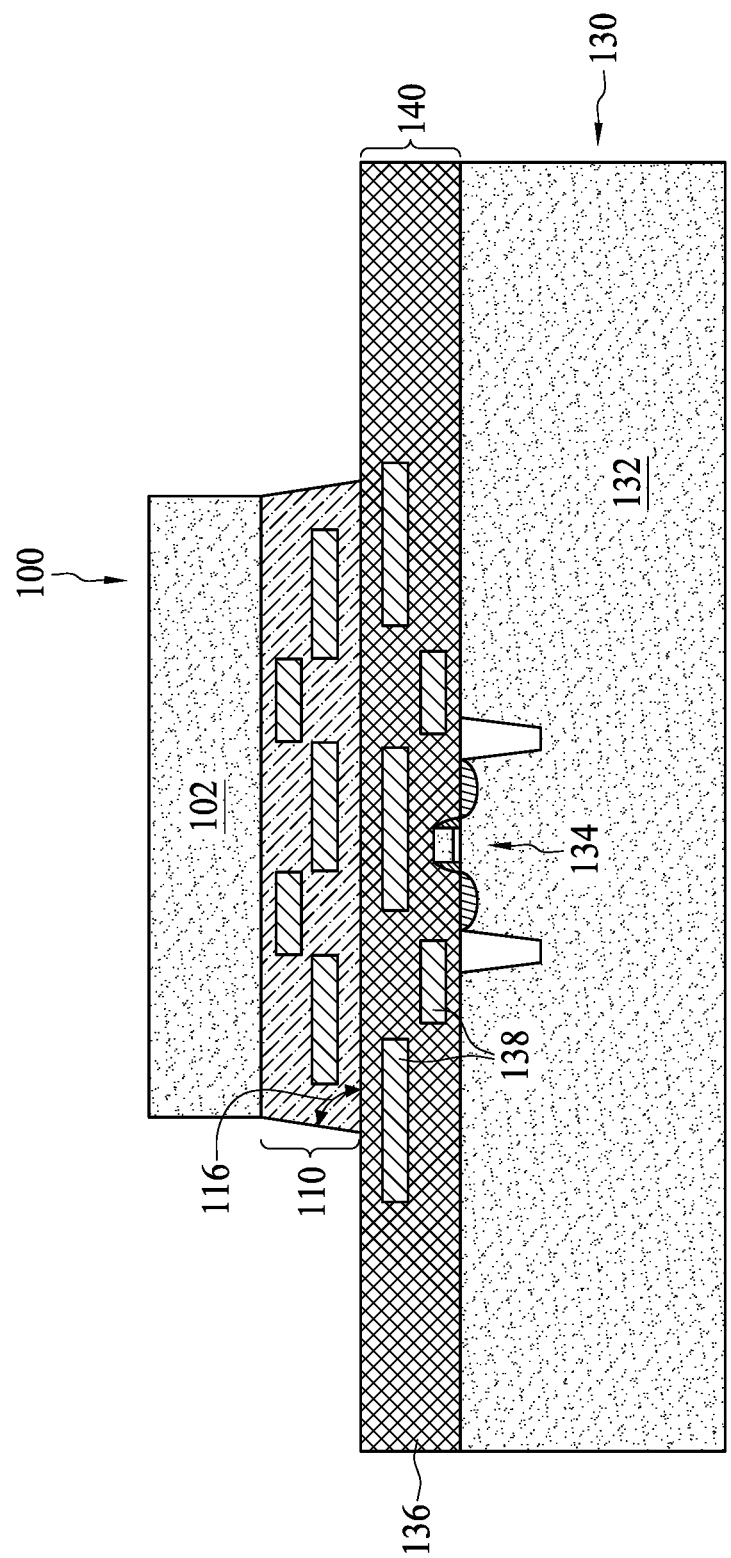

Referring to FIG. 6, a second integrated circuit chip (or more simply, "chip") 130 is shown prior to a singulation. Much of the discussion of the first chip 100 in FIG. 1 is applicable to the second chip 130 in FIG. 6. One of ordinary skill in the art will readily understand the correspondence of features and discussion between the first chip 100 and the second chip 130, and therefore, some discussion of features of the second chip 130 is omitted herein for brevity. The second chip 130 includes a second semiconductor substrate 132 having second electrical circuitry (illustrated as including second transistor 134) and has a second chip front side interconnect structure 140 having one or more dielectric layer 136 with a respective metallization pattern 138. The second electrical circuitry may include memory structures, data processing structures, sensors, amplifiers, power distribution, input/output circuitry, or the like. The second semiconductor substrate 132 is part of a larger semiconductor substrate, such as a wafer, with other similar or same chips formed thereon before singulation.

Referring further to FIG. 6, the first chip 100 is then bonded to the second chip 130, such as while the second chip 130 is part of the larger substrate, e.g., a wafer. Hence, FIG. 6 can depict Chip-on-Wafer (CoW) bonding. The first chip 100 may be removed from the dicing tape 120 and aligned over the second chip 130 using a pick-and-place tool. The first chip 100 is then contacted with the second chip 130, and bonding occurs. As illustrated, the first chip front side interconnect structure 110 of the first chip 100 is bonded to the second chip front side interconnect structure 140 of the second chip 130. For ease of reference subsequently, the first chip 100 and the second chip 130, as bonded, may be referred to as chip stack 100/130. The bonding may include bonding one dielectric layer 106 of the first chip 100 that is most distal from the first semiconductor substrate 102 to one dielectric layer 136 of the second chip 130 that is most distal from the second semiconductor substrate 132. The bonding may further include bonding a metallization pattern 108 of the first chip 100 that is most distal from the first semiconductor substrate 102 to a metallization pattern 138 of the second chip 130 that is most distal from the second semiconductor substrate 132. Further, the bonding may include bonding a dielectric layer 106 of the first chip 100 to a metallization pattern 138 of the second chip 130, and/or a metallization pattern 108 of the first chip 100 to a dielectric layer 136 of the second chip 130. Hence, bonding can include dielectric-to-dielectric bonding, metal-to-metal bonding, metal-to-dielectric bonding, and/or the like. In some instances, metal-to-metal bonding allows electrical interconnections between the first chip 100 and the second chip 130.

As further shown in FIG. 6, the interior angle 116 of a sidewall of the first chip 100 to the bonding interface between the first chip 100 and the second chip 130 is present in the bonded structure. As previously discussed, the singulation etch process can cause a sidewall of the first chip 100 to be non-vertical, which in turn, can cause the interior angle 116 to be present between that non-vertical sidewall and the bonding interface between the first chip 100 and the second chip 130.

Figure 7:
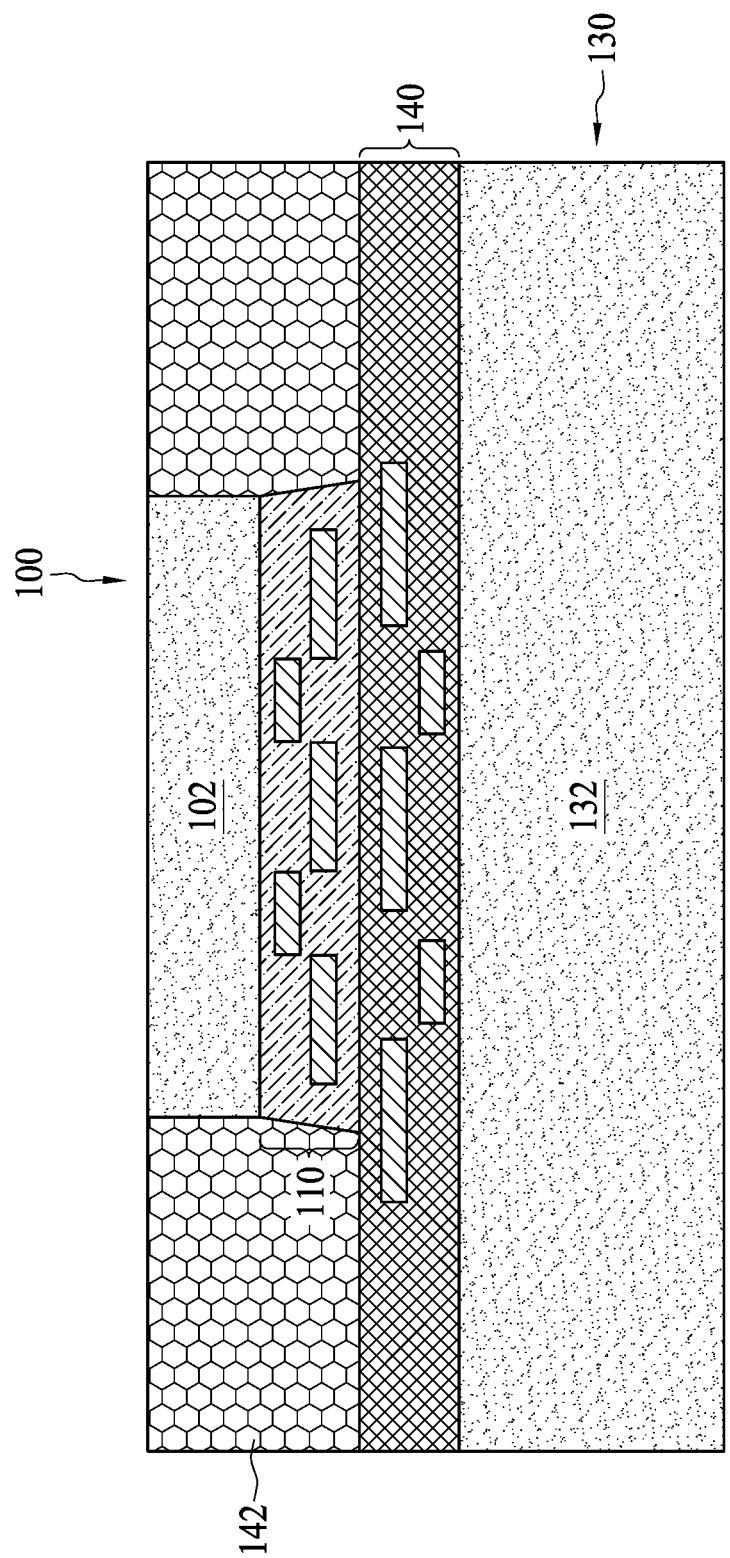

With reference to FIG. 7, the first chip 100 is encapsulated with an encapsulant 142 on the second chip 130, such as while the second chip 130 is part of the larger substrate. The encapsulant 142 can be a molding compound, epoxy, resin, or the like, and can be formed encapsulating the first chip 100 using compression molding, transfer molding, or the like.

Figure 8:
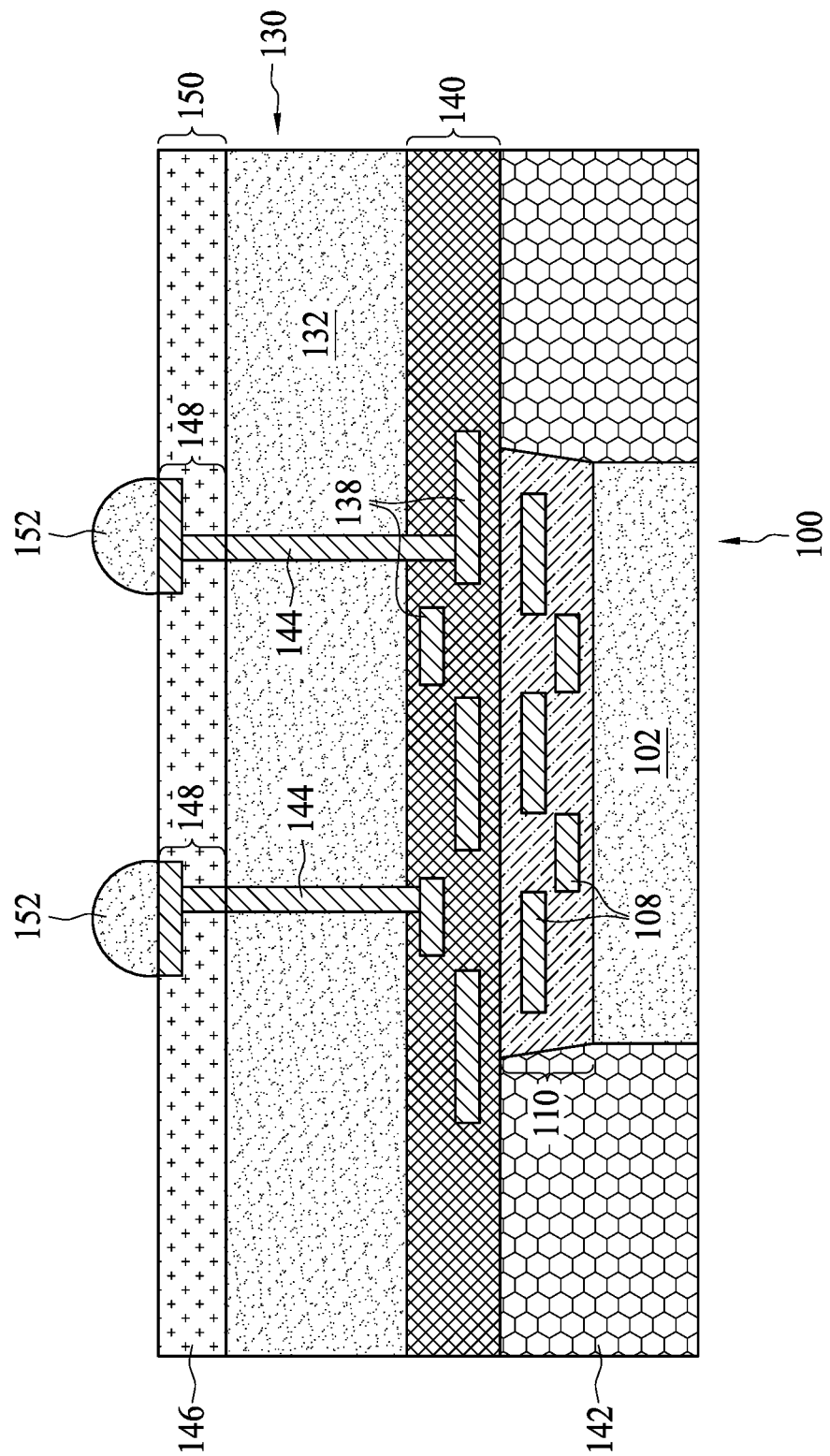

With reference to FIG. 8, processing on the back side of the second semiconductor substrate 132 is performed. Such processing can include thinning the second semiconductor substrate 132. The thinning process can thin the second semiconductor substrate 132 from the back side of the second semiconductor substrate 132. The thinning process can include a grinding process such as a CMP, an etch-back process, the like, or a combination thereof. In some embodiments, before thinning the second semiconductor substrate 132, the thickness of the second chip 130 (e.g., a combined thickness of the second semiconductor substrate 132 and the second chip front side interconnect structure 140) can be approximately 300 μm or greater, and after thinning the second semiconductor substrate 132, the thickness can be approximately 5 μm or greater, for example, between about 5 μm and about 20 μm.

Thereafter, through vias 144 and a second chip back side interconnect structure 150 having one or more dielectric layer 146 with a respective metallization pattern 148 are formed. The following discussion describes an example configuration of such features, although some details described herein may not be explicitly illustrated in FIG. 8. One of ordinary skill in the art will readily understand that other configurations can be used.

The through vias 144 are through the second semiconductor substrate 132. An electrical connection is formed extending from the back side of the second semiconductor substrate 132 to one or more of the metallization patterns 138 and/or 108. First, openings are formed for the through vias 144 through the second semiconductor substrate 132. The openings may be formed using photolithography techniques, for example, to deposit and pattern a photoresist material on the back side of the second semiconductor substrate 132 to expose the second semiconductor substrate 132 where the openings will be formed. An etch process, such as an anisotropic dry etch process, may be used to create the openings in the second semiconductor substrate 132. Various layers may be present on the second semiconductor substrate 132 during these processes, such as hardmask layer(s), ARC layer(s), the like, or a combination thereof.

One or more dielectric film(s) can be formed over the backside of the second semiconductor substrate 132 and along sidewalls of the openings in the second semiconductor substrate 132. A dielectric film(s) can provide passivation and isolation between through vias and device circuits and can provide protection to the second semiconductor substrate 132 during, for example, a subsequent etch process. Further, a dielectric film(s) may provide protection against metal ions diffusing into the second semiconductor substrate 132.

In an embodiment, a multi-layered dielectric film is formed along the backside of the second semiconductor substrate 132 and in the openings. The multi-layered dielectric film comprises a first dielectric film and a second dielectric film over the first dielectric film. The materials of the first dielectric film and the second dielectric film are selected such that there is a relatively high etch selectivity between the two layers. An example of dielectric materials that may be used is a nitride material for the first dielectric film and an oxide for the second dielectric film. The nitride layer, such as a silicon nitride ($Si_3N_4$) layer, may be formed using CVD techniques. The oxide layer, such as a silicon dioxide layer, may be formed by thermal oxidation or by CVD techniques. Other materials, including other oxides, other nitrides, SiON, SiC, low k dielectric materials (e.g., Black Diamond), and/or high k oxides (e.g., $HfO_2$, $Ta_2O_5$) may be used. Spacer-shaped structures are formed from the second dielectric film using, for example, a dry etch process such that the second dielectric film is etched while causing little or no damage to the first dielectric film.

A patterned mask is formed over the back side of the second semiconductor substrate 132, which may be, for example, a photoresist material that has been deposited, masked, exposed, and developed as part of a photolithography process. The patterned mask is patterned to define via openings extending through the respective openings through the second semiconductor substrate 132 and through the dielectric layers 136 and/or 106, thereby exposing portions of one or more of the metallization patterns 138 and/or 108. One or more etching processes are performed to form these via openings. A suitable etching process, such as a dry etch, an anisotropic wet etch, or any other suitable anisotropic etch or patterning process, may be performed to form the via openings. It should be noted that the etch process may extend through a variety of various layers used to form the dielectric layers, which may include various types of materials and etch stop layers. Accordingly, the etch process may utilize multiple etchants to etch through the various layers, wherein the etchants are selected based upon the materials being etched.

A conductive material is formed within the via openings. In an embodiment, the conductive material may be formed by depositing one or more diffusion and/or barrier layers and depositing a seed layer. For example, a diffusion barrier layer comprising one or more layers of Ta, TaN, TiN, Ti, cobalt tungsten, or the like may be formed along the sidewalls of the via openings. The seed layer (not shown) may be formed of copper, nickel, gold, any combination thereof and/or the like. The diffusion barrier layer and the seed layer may be formed by suitable deposition techniques such as physical vapor deposition (PVD), CVD, and/or the like. Once the seed layer has been deposited in the openings, a conductive material, such as tungsten, titanium, aluminum, copper, any combinations thereof and/or the like, is filled into the via openings, using, for example, an electro-chemical plating process or other suitable process. The filled via openings form through vias 144.

Excess materials, e.g., excess conductive materials and/or dielectric films, may be removed from the back side of the second semiconductor substrate 132. In embodiments, one or more of the layers of the multi-layer dielectric film may be left along the back side of the second semiconductor substrate 132 to provide additional protection from the environment. Any excess materials may be removed using an etch process, a grinding or polishing process (e.g., a CMP process), or the like.

One or more dielectric layer 146 with one or more metallization pattern 148 of the second chip back side interconnect structure 150 can then be formed on the back side of the second semiconductor substrate 132. For example, the one or more dielectric layer 146 can include a dielectric capping layer formed along a back side of the second semiconductor substrate 132. The dielectric capping layer may comprise one or more layers of dielectric materials, such as silicon nitride, silicon oxynitride, silicon oxycarbide, silicon carbide, combinations thereof, and multi-layers thereof formed by, for example, using suitable deposition techniques such as sputtering, CVD, and the like.

A via can be formed through the dielectric capping layer to each through via 144. The vias may be formed, for example, by using photolithography techniques to deposit and pattern a photoresist material on the dielectric capping layer to expose the portion of the dielectric capping layer that is to be removed for the vias. An etch process, such as an anisotropic dry etch process, may be used to create an opening in the dielectric capping layer. The opening may be lined with a diffusion barrier layer and/or an adhesion layer (not shown), and filled with a conductive material. The diffusion barrier layer may comprise one or more layers of TaN, Ta, TiN, Ti, cobalt tungsten, or the like, and the conductive material may comprise copper, tungsten, aluminum, silver, and combinations thereof, or the like, thereby forming the via through the capping layer to a respective through via 144.

A conductive pad can be formed over and in electrical contact with the via and over the dielectric capping layer. The conductive pad may comprise aluminum, but other materials, such as copper, may be used. The conductive pad may be formed using a deposition process, such as sputtering or other suitable process, to form a layer of material, and thereafter, portions of the layer of material may be removed through a suitable process (such as photolithographic masking and etching) to form the conductive pad. However, any suitable process may be utilized to form the conductive pad.

A passivation layer can be formed on the dielectric capping layer and the conductive pad. The passivation layer may comprise one or more suitable dielectric materials such as silicon oxide, silicon nitride, combinations of these, or the like. The passivation layer may be formed using, for example, CVD, PECVD, or any suitable process. After the passivation layer has been formed, an opening may be made through the passivation layer to the conductive pad by removing a portion of the passivation layer to expose at least a portion of the underlying conductive pad. The opening may be formed using a suitable photolithographic and etching process.

A first dielectric layer can be formed over the passivation layer. The first dielectric layer may be formed of a polymer such as a polyimide, polybenzoxazole (PBO), benzocyclobutene (BCB), and the like. The first dielectric layer may be formed by spin coating, laminating, or the like. The first dielectric layer is patterned to form an opening through the opening in the passivation layer and through which the conductive pad is exposed. The patterning of first dielectric layer may include photolithography techniques. A curing step may be performed to cure the first dielectric layer.

A post-passivation interconnect (PPI) can be formed over the first dielectric layer and fills the opening in the first dielectric layer and the passivation layer, thereby forming an electrical connection with the conductive pad. The PPI may be utilized as a redistribution layer to allow a subsequently formed under bump metal (UBM) that is electrically connected to the conductive pad to be placed in any desired location on the second chip 130. In an embodiment, the PPI may be formed by forming a seed layer, which may comprise a titanium copper alloy, using a suitable formation process such as PVD, sputtering, or the like. A photoresist may then be formed to cover the seed layer and patterned to expose portions of the seed layer that are located where the PPI is desired to be located. Once the photoresist has been formed and patterned, a conductive material, such as copper, may be formed on the seed layer through a deposition process such as plating. While the material and methods discussed are suitable to form the conductive material, these materials and methods are merely examples. Any other suitable materials, such as AlCu or Au, and any other suitable processes of formation, such as CVD or PVD, may be used to form the PPI. Once the conductive material has been formed, the photoresist may be removed through a suitable removal process such as ashing, such as by using an oxygen plasma. Additionally, after the removal of the photoresist, the portions of the seed layer that were covered by the photoresist may be removed through, for example, a suitable etch process.

A second dielectric layer is formed over the PPI and the first dielectric layer. The second dielectric layer may be formed of a polymer such as a polyimide, PBO, BCB, and the like. The second dielectric layer may be formed by spin coating, laminating, or the like. The second dielectric layer is patterned to form an opening through which the PPI is exposed. The patterning of the second dielectric layer may include photolithography techniques. A curing step may be performed to cure the second dielectric layer.

A UBM may be formed in the opening in the second dielectric layer and in electrical contact with the PPI. The UBM may comprise three layers of conductive materials, such as a layer of titanium, a layer of copper, and a layer of nickel. One of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that may be suitable for the formation of the UBM.

The UBM may be formed by forming each layer over the second dielectric layer and along the interior of the opening through the second dielectric layer to the PPI. Each layer may be formed using a plating process, such as electrochemical plating, although other processes of formation, such as sputtering, evaporation, or PECVD process, may be used. Once the desired layers have been formed, portions of the layers may then be removed through a suitable photolithographic masking and etching process to remove the undesired material and to leave the UBM in a desired shape.

A contact bump 152 is formed on the UBM. The contact bump 152 may be a controlled collapse chip connection (C4) and/or may comprise a material such as solder, tin, or other suitable materials, such as silver, lead-free tin, or copper. In an embodiment in which the contact bump 152 is a tin solder bump, the contact bump 152 may be formed by initially forming a layer of tin through evaporation, electroplating, printing, solder transfer, ball placement, etc. Once a layer of tin has been formed on the structure, a reflow may be performed in order to shape the material into the desired bump shape. Other bump structures may be used. For example, a metal pillar with a solder connector may also be used.

After the processing illustrated in FIG. 8, a singulation process can be performed to singulate the chip stack 100/130 from the larger substrate of the second semiconductor substrate 132. In some embodiments, the singulation process can be an etch singulation process similar to the process discussed above with respect to FIGS. 2 through 5. In other embodiments, the singulation process can use a sawing process, while in further embodiments, the singulation process can be a combination sawing and etching singulation process.

Figure 9:
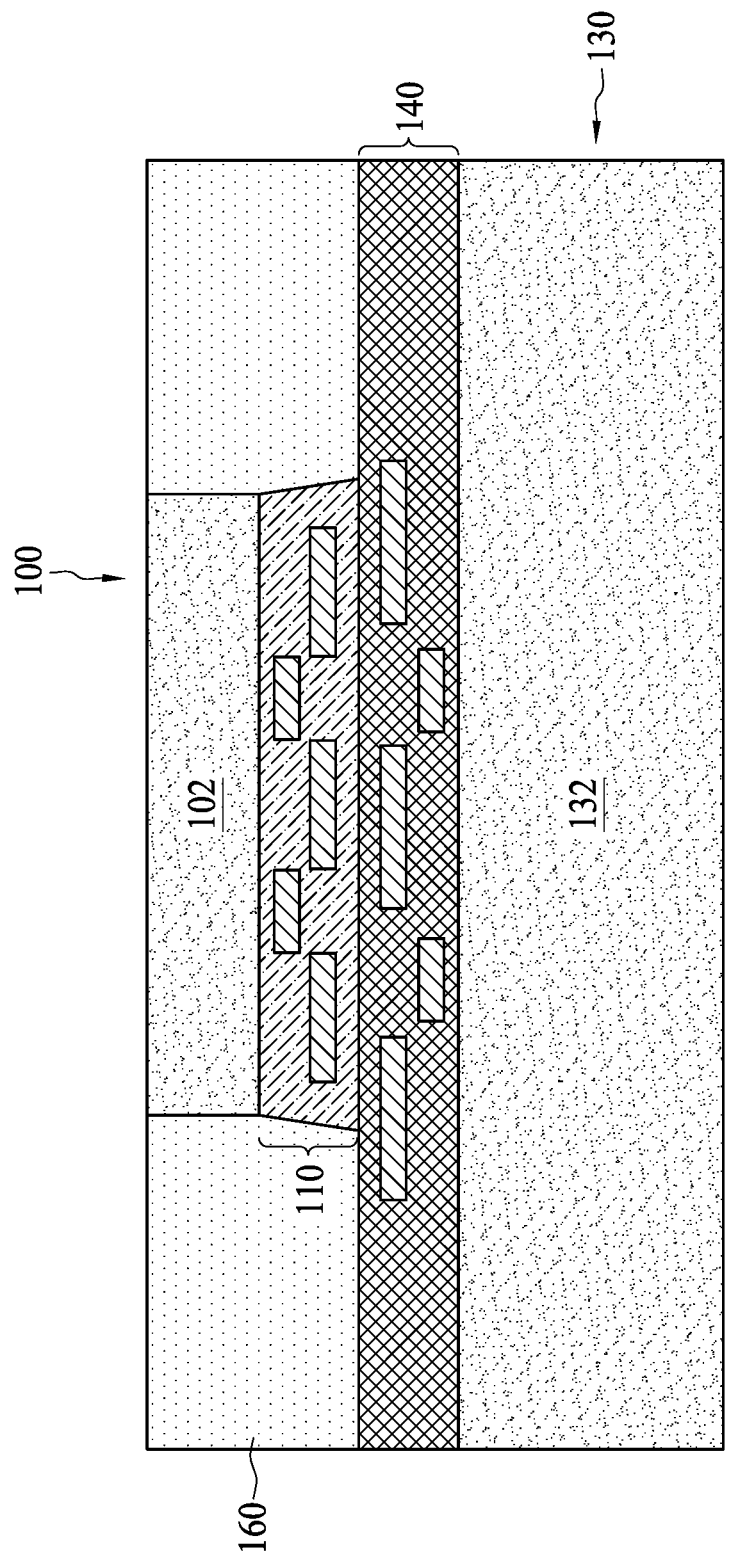
FIGS. 9 through 11 are various cross-sectional views of structures in intermediate steps of a second embodiment wherein a chip is singulated and bonded to a larger substrate.

FIGS. 1 through 6 and 9 through 11 illustrate various cross-sectional views of structures in intermediate steps of a second embodiment wherein a chip is singulated and bonded to a larger substrate, e.g., a wafer. Processing proceeds as discussed above with respect to FIGS. 1 through 6. With reference to FIG. 9, the first chip 100 is encapsulated with an encapsulant 160 on the second chip 130, such as while the second chip 130 is part of a larger substrate. In some embodiments, such as when subsequent processing uses only low temperature processes, the encapsulant 160 can be a molding compound, epoxy, resin, or the like, and can be formed encapsulating the first chip 100 using compression molding, transfer molding, or the like. In some embodiments, such as when subsequent processing includes a high temperature process, the encapsulant 160 can be a dielectric encapsulant, such as an oxide dielectric used during Front End of the Line (FEOL) processing, such as an oxide deposited by PECVD, tetraethyl orthosilicate (TEOS) deposited by Flowable Chemical Vapor Deposition (FCVD), or the like. A planarization process, such as a CMP, can be used to planarize the back side of the first semiconductor substrate 102 with the encapsulant 160 and/or to remove excess encapsulant 160.

Figure 10:
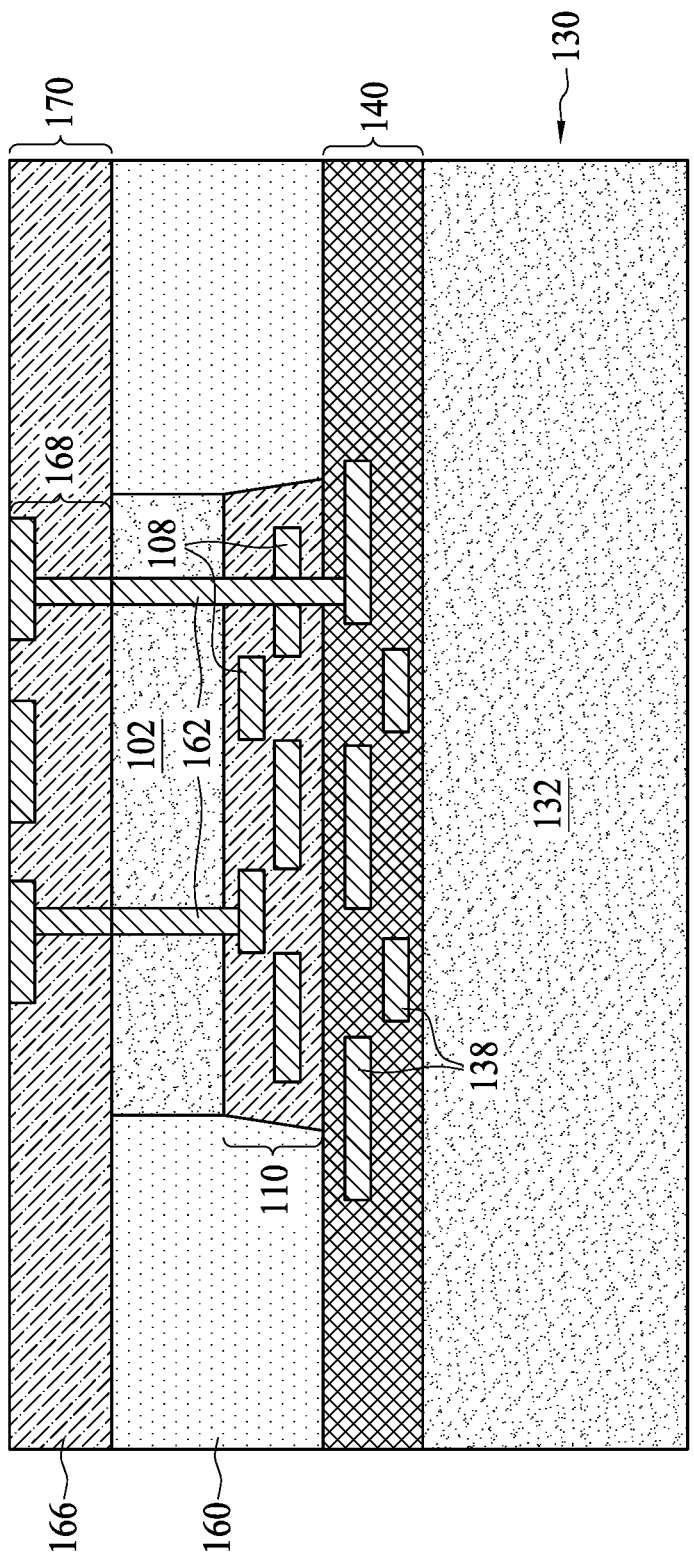

With reference to FIG. 10, through vias 162 and a first chip stack interconnect structure 170 with one or more dielectric layer 166 with a respective metallization pattern 168 are formed. The through vias 162 are through the first semiconductor substrate 102. An electrical connection is formed extending from the back side of the first semiconductor substrate 102 to one or more of the metallization patterns 138 and/or 108. The through vias 162 can be formed using processes as discussed above with respect to the formation of through vias 144 in FIG. 8. The metallization patterns 168 of the first chip stack interconnect structure 170 are connected to the through vias 162 to provide electrical connections from the first chip stack interconnect structure 170 to the first chip 100 and the second chip 130. In some embodiments, such as when subsequent processing uses only low temperature processes, the first chip stack interconnect structure 170 can be formed using processes as discussed above with respect to the second chip back side interconnect structure 150 in FIG. 8. In some embodiments, such as when subsequent processing includes a high temperature process, the first chip stack interconnect structure 170 can be formed using processes as discussed above with respect to formation of the first chip front side interconnect structure 110 in FIG. 1.

Figure 11:
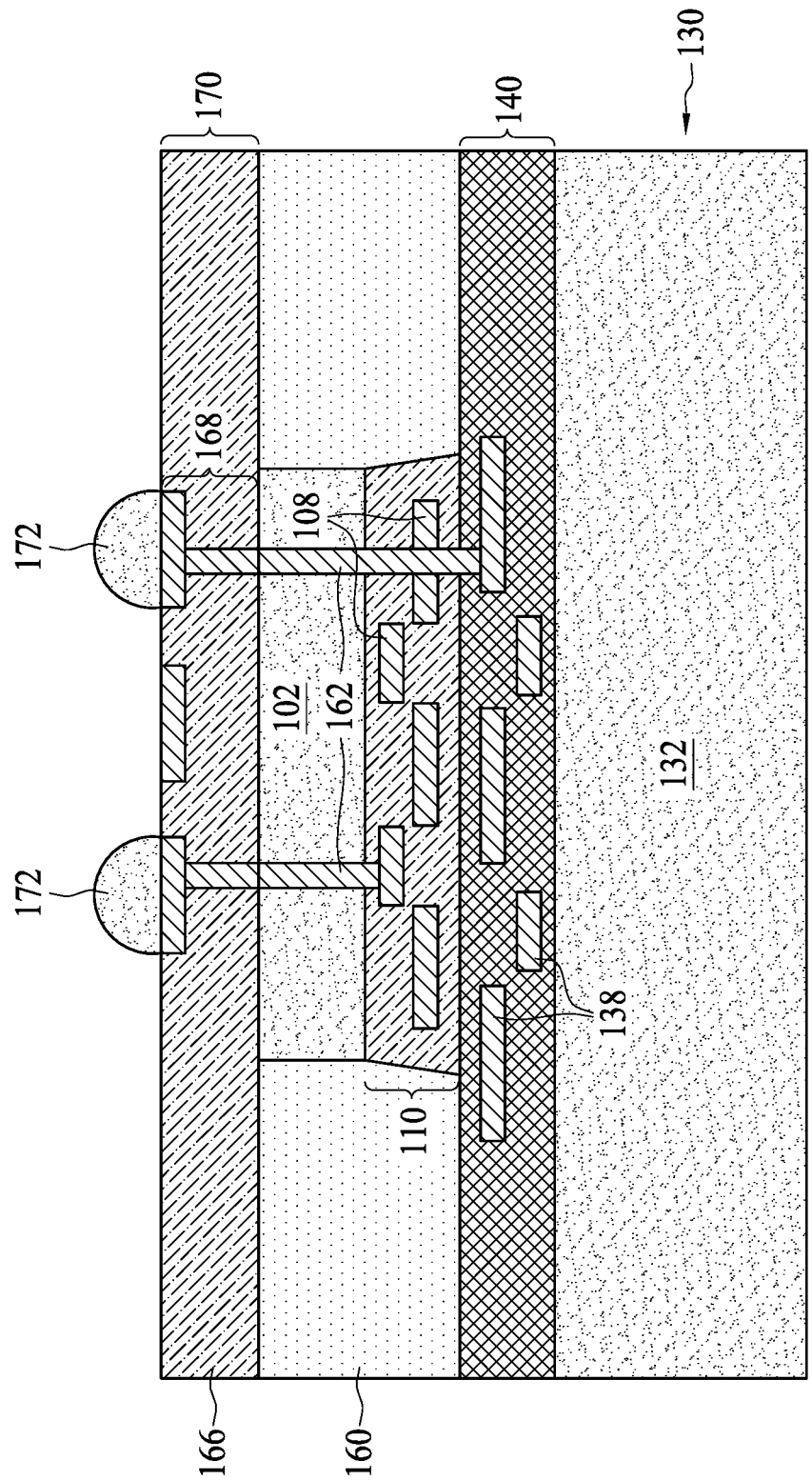

With reference to FIG. 11, contact bumps 172 are formed on the first chip stack interconnect structure 170 electrically coupled to the metallization patterns 168. The contact bumps 172, with any UBMs, can be formed as discussed above with respect to the formation of contact bumps 152, and UBMs, respectively, in FIG. 8. After the processing illustrated in FIG. 11, a singulation process can be performed to singulate the chip stack 100/130 from the larger substrate of the second semiconductor substrate 132. In some embodiments, the singulation process can be an etch singulation process similar to the process discussed above with respect to FIGS. 2 through 5. In other embodiments, the singulation process can use a sawing process, while in further embodiments, the singulation process can be a combination sawing and etching singulation process.

Figure 12:
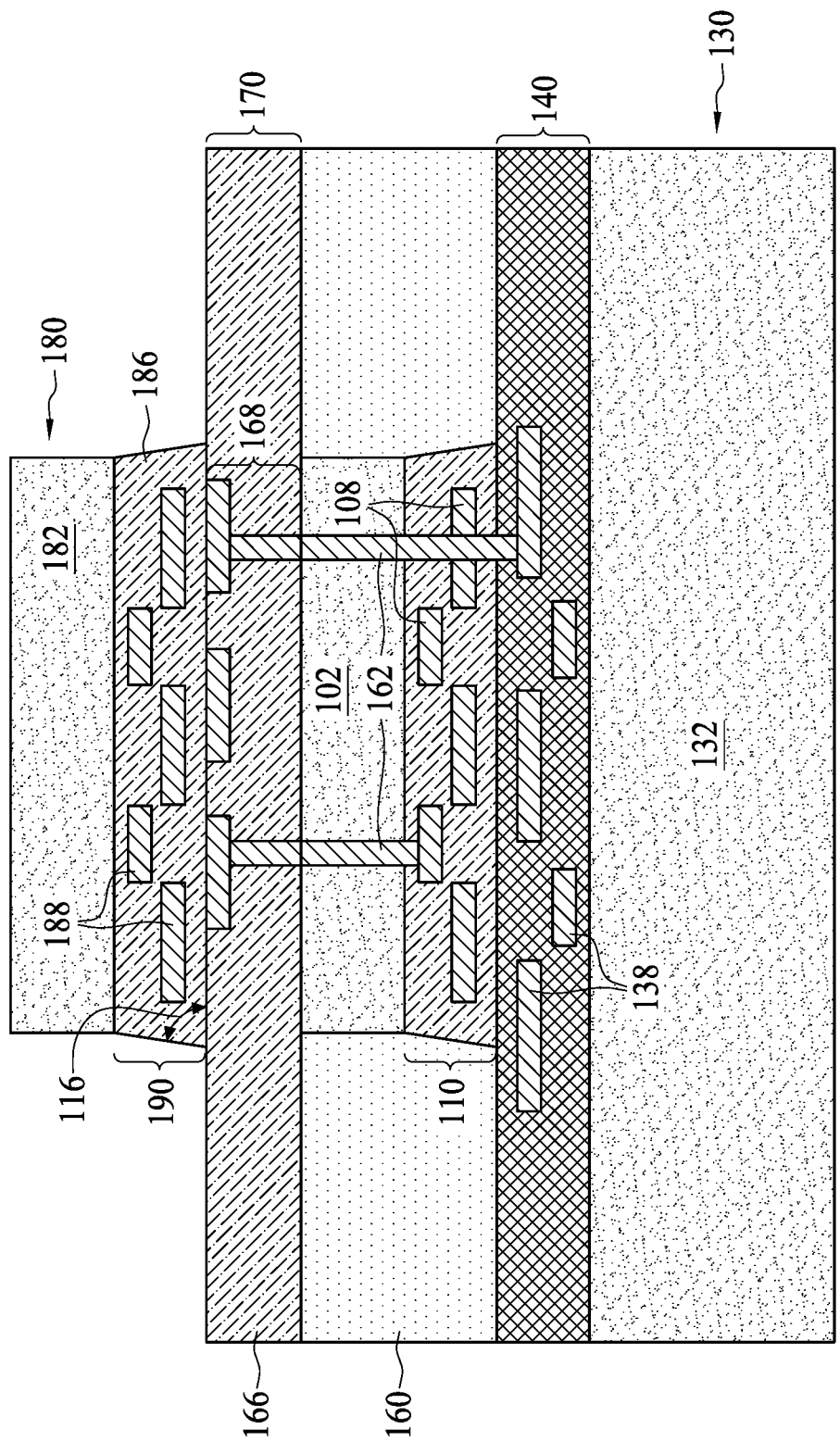
FIGS. 12 and 13 are various cross-sectional views of structures in intermediate steps of a third embodiment wherein a chip(s) is singulated and bonded to a larger substrate.

FIGS. 1 through 6, 9, 10, 12, and 13 illustrate various cross-sectional views of structures in intermediate steps of a third embodiment wherein a chip(s) is singulated and bonded to a larger substrate, e.g., a wafer. Processing proceeds as discussed above with respect to FIGS. 1 through 6, 9 and 10. With reference to FIG. 12, a third integrated circuit chip (or more simply, "chip") 180 is bonded to the first chip stack interconnect structure 170. Much of the discussion of the first chip 100 in FIG. 1 is applicable to the third chip 180 in FIG. 12. One of ordinary skill in the art will readily understand the correspondence of features and discussion between the first chip 100 and the third chip 180, and therefore, some discussion of features of the third chip 180 is omitted herein for brevity. The third chip 180 includes a third semiconductor substrate 182 having a third electrical circuit and has a third chip front side interconnect structure 190 having one or more dielectric layer 186 with a respective metallization pattern 188. The third electrical circuitry may include memory structures, data processing structures, sensors, amplifiers, power distribution, input/output circuitry, or the like. The third chip 180 may undergo processing similar to the processing discussed above with respect to FIGS. 1 through 5.

The third chip 180 is bonded to the first chip stack interconnect structure 170, such as while the second chip 130 is part of a larger substrate, e.g., a wafer. Hence, FIG. 12 can depict CoW bonding. The bonding of the third chip 180 to the first chip stack interconnect structure 170 may be as discussed with respect to the bonding in FIG. 6. As illustrated, the third chip front side interconnect structure 190 of the third chip 180 is bonded to the first chip stack interconnect structure 170. The bonding may include bonding one dielectric layer 186 of the third chip 180 that is most distal from the third semiconductor substrate 182 to one dielectric layer 166 of the first chip stack interconnect structure 170 that is most distal from the first semiconductor substrate 102. The bonding may further include bonding a metallization pattern 188 of the third chip 180 that is most distal from the third semiconductor substrate 182 to a metallization pattern 168 of the first chip stack interconnect structure 170 that is most distal from the first semiconductor substrate 102. Further, the bonding may include bonding a metallization pattern 188 of the third chip 180 to a dielectric layer 166 of the first chip stack interconnect structure 170, and/or a dielectric layer 186 of the third chip 180 to a metallization pattern 168 of the first chip stack interconnect structure 170. Hence, bonding can include dielectric-to-dielectric bonding, metal-to-metal bonding, metal-to-dielectric bonding, and/or the like. In some instances, metal-to-metal bonding allows electrical interconnections between the first chip 100, the second chip 130, and the third chip 180.

As further shown in FIG. 12, the interior angle 116 of a sidewall of the third chip 180 to the bonding interface between the third chip 180 and the first chip stack interconnect structure 170 is present in the bonded structure. As previously discussed, the singulation etch process can cause a sidewall of the third chip 180 to be non-vertical, which in turn, can cause the interior angle 116 to be present between that non-vertical sidewall and the bonding interface between the third chip 180 and the first chip stack interconnect structure 170.

Figure 13:
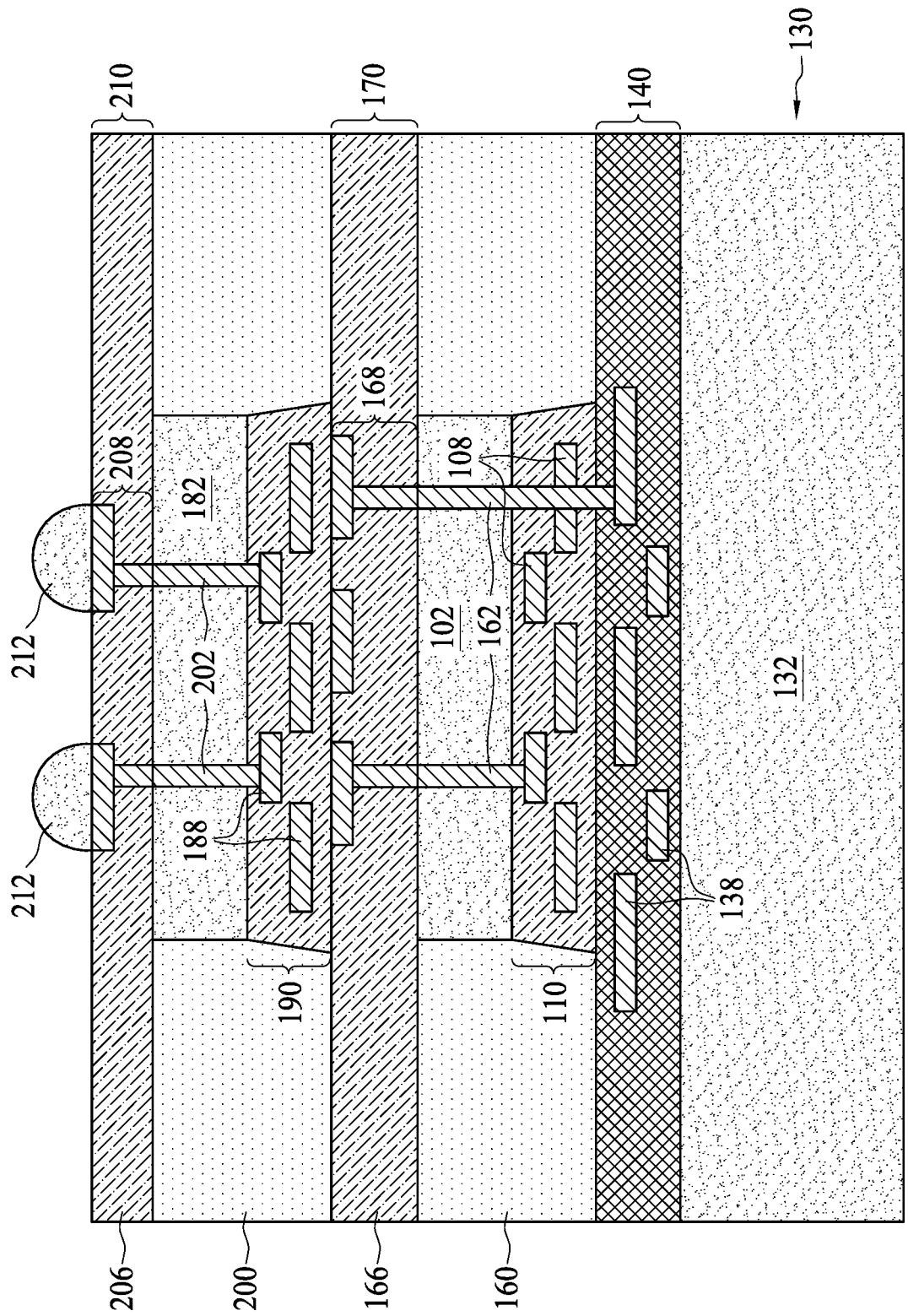

With reference to FIG. 13, the third chip 180 is encapsulated with an encapsulant 200 on the first chip stack interconnect structure 170, such as while the second chip 130 is part of the larger substrate. The encapsulant 200 can be as discussed above with respect to the encapsulant 160 in FIG. 9. Through vias 202 and a second chip stack interconnect structure 210 with one or more dielectric layer 206 and metallization pattern 208 are formed. The through vias 202 are through the third semiconductor substrate 182. An electrical connection is formed extending from the back side of the third semiconductor substrate 182 to one or more of the metallization patterns 188 and/or 168. The through vias 162 can be formed using processes as discussed above with respect to the formation of through vias 144 in FIG. 8. The metallization patterns 208 of the second chip stack interconnect structure 210 are connected to the through vias 202 to provide electrical connections from the second chip stack interconnect structure 210 to the first chip 100, the second chip 130, and the third chip 180. The second chip stack interconnect structure 210 can be formed using processes as discussed above with respect to the first chip stack interconnect structure 170 in FIG. 10. Contact bumps 212 are formed on the second chip stack interconnect structure 210 electrically coupled to the metallization patterns 208. The contact bumps 212, with any UBMs, can be formed as discussed above with respect to the formation of contact bumps 152, and UBMs, respectively, in FIG. 8.

After the processing illustrated in FIG. 13, a singulation process can be performed to singulate the chip stack 100/130/180 from the larger substrate of the second semiconductor substrate 132. In some embodiments, the singulation process can be an etch singulation process similar to the process discussed above with respect to FIGS. 2 through 5. In other embodiments, the singulation process can use a sawing process, while in further embodiments, the singulation process can be a combination sawing and etching singulation process.

Figure 14:
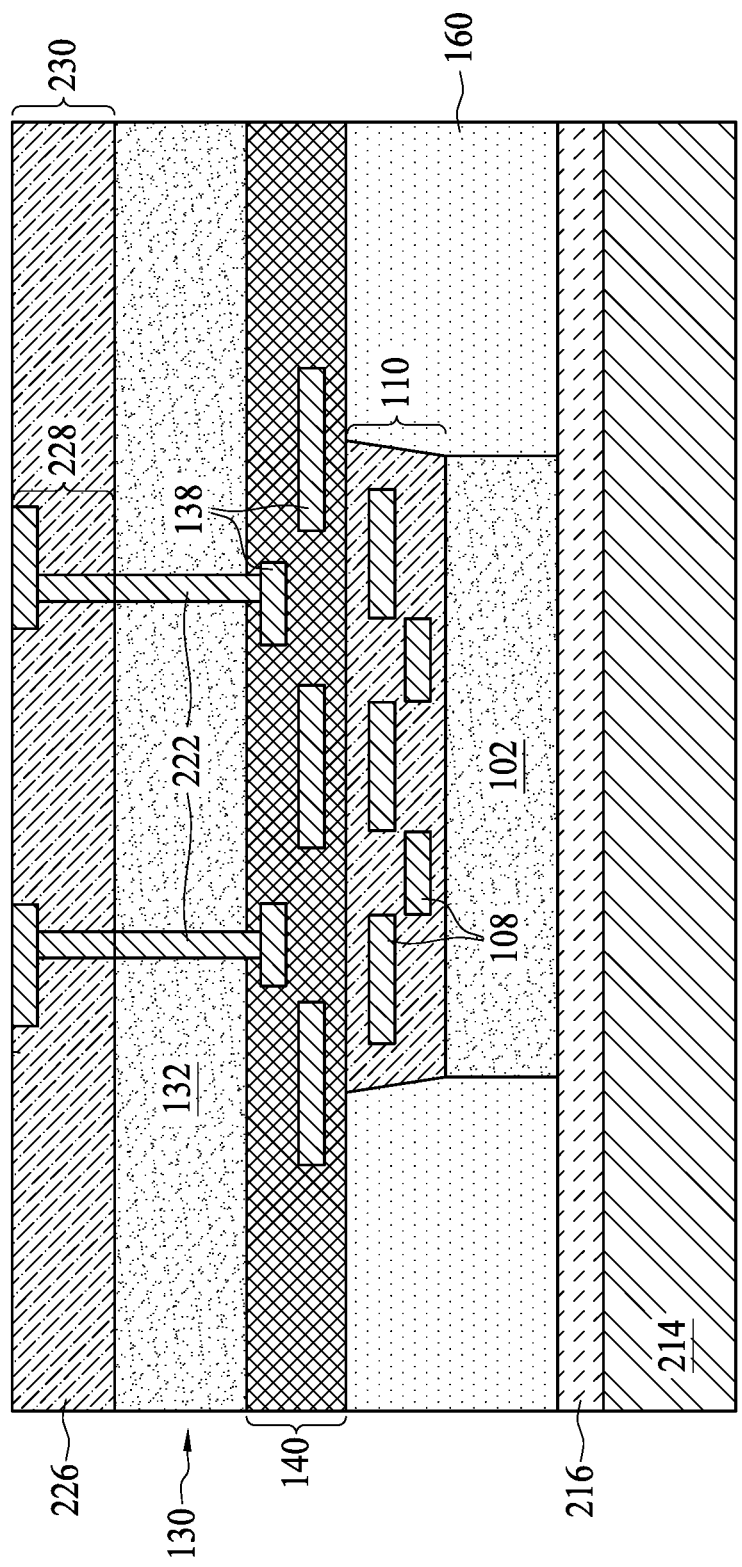
FIGS. 14 through 16 are various cross-sectional views of structures in intermediate steps of a fourth embodiment wherein a chip(s) is singulated and bonded to a larger substrate.

FIGS. 1 through 6, 9, and 14 through 16 illustrate various cross-sectional views of structures in intermediate steps of a fourth embodiment wherein a chip(s) is singulated and bonded to a larger substrate, e.g., a wafer. Processing proceeds as discussed above with respect to FIGS. 1 through 6 and 9. With reference to FIG. 14, processing on the back side of the second semiconductor substrate 132 is performed. The first chip 100, as encapsulated in the encapsulant 160, is adhered to a carrier substrate 214 by a release layer 216. The release layer 216 adheres the back side of the first chip 100 and the encapsulant 160 to the carrier substrate 214. The carrier substrate 214 and release layer 216 may be as discussed with respect to the carrier substrate 112 and release layer 114, respectively, in FIG. 2.

Once the first chip 100 is adhered to the carrier substrate 214, the second semiconductor substrate 132, as part of the larger substrate, may be thinned. The thinning process can thin the second semiconductor substrate 132 from the back side of the second semiconductor substrate 132. The thinning process can include a grinding process such as a CMP, an etch-back process, the like, or a combination thereof. In some embodiments, before thinning the second semiconductor substrate 132, the thickness of the second chip 130 (e.g., a combined thickness of the second semiconductor substrate 132 and the second chip front side interconnect structure 140) can be approximately 300 μm or greater, and after thinning the second semiconductor substrate 132, the thickness can be approximately 5 μm or greater, for example, between about 5 μm and about 20 μm.

Through vias 222 and a second chip back side interconnect structure 230 with one or more dielectric layer 226 with a respective metallization pattern 228 are formed. The through vias 222 are through the second semiconductor substrate 132. An electrical connection is formed extending from the back side of the second semiconductor substrate 132 to one or more of the metallization patterns 138 and/or 108. The through vias 222 can be formed using processes as discussed above with respect to the formation of through vias 144 in FIG. 8. The metallization patterns 228 of the second chip back side interconnect structure 230 are connected to the through vias 222 to provide electrical connections from the second chip back side interconnect structure 230 to the first chip 100 and the second chip 130. The second chip back side interconnect structure 230 can be formed using processes as discussed above with respect to the first chip stack interconnect structure 170 in FIG. 10.

Figure 15:
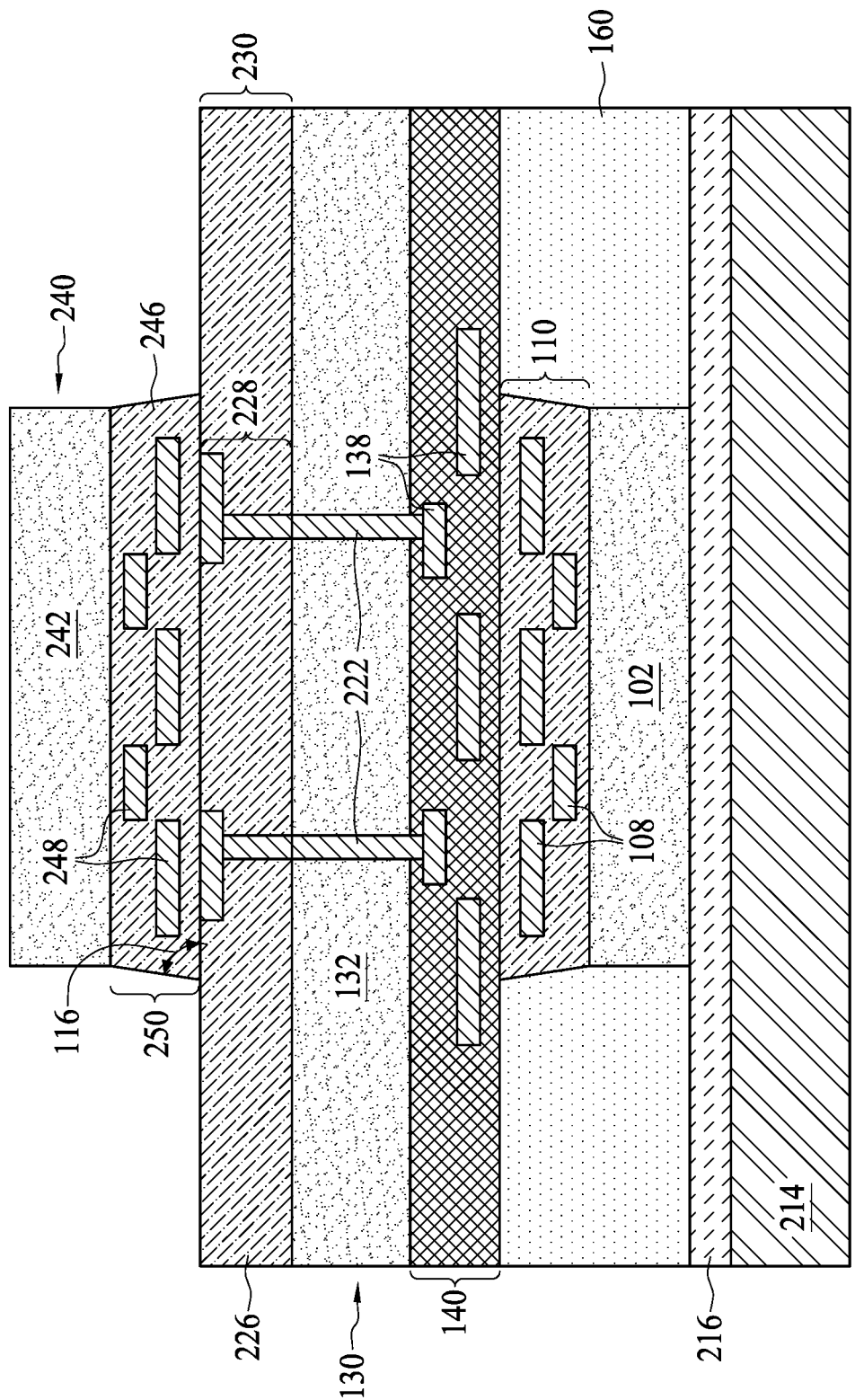

With reference to FIG. 15, a third integrated circuit chip (or more simply, "chip") 240 is bonded to the second chip 130, e.g., the second chip back side interconnect structure 230. Much of the discussion of the first chip 100 in FIG. 1 is applicable to the third chip 240 in FIG. 15. One of ordinary skill in the art will readily understand the correspondence of features and discussion between the first chip 100 and the third chip 240, and therefore, some discussion of features of the third chip 240 is omitted herein for brevity. The third chip 240 includes a third semiconductor substrate 242 having a third electrical circuit and has a third chip front side interconnect structure 250 having one or more dielectric layer 246 with a respective metallization pattern 248. The third electrical circuitry may include memory structures, data processing structures, sensors, amplifiers, power distribution, input/output circuitry, or the like. The third chip 240 may undergo processing similar to the processing discussed above with respect to FIGS. 1 through 5.

The third chip 240 is bonded to the second chip back side interconnect structure 230, such as while the second chip 130 is part of the larger substrate, e.g., a wafer. Hence, FIG. 15 can depict CoW bonding. As illustrated, the third chip front side interconnect structure 250 of the third chip 240 is bonded to the second chip back side interconnect structure 230. The bonding may include bonding one dielectric layer 246 of the third chip 240 that is most distal from the third semiconductor substrate 242 to one dielectric layer 226 of the second chip back side interconnect structure 230 of the second chip 130 that is most distal from the second semiconductor substrate 132. The bonding may further include bonding a metallization pattern 248 of the third chip 240 that is most distal from the third semiconductor substrate 242 to a metallization pattern 228 of the second chip back side interconnect structure 230 of the second chip 130 that is most distal from the second semiconductor substrate 132. Further, the bonding may include bonding a metallization pattern 248 of the third chip 240 to a dielectric layer 226 of the second chip back side interconnect structure 230, and/or a dielectric layer 246 of the third chip 240 to a metallization pattern 228 of the second chip back side interconnect structure 230. Hence, bonding can include dielectric-to-dielectric bonding, metal-to-metal bonding, metal-to-dielectric bonding, and/or the like. In some instances, metal-to-metal bonding allows electrical interconnections between the first chip 100, the second chip 130, and the third chip 240.

As further shown in FIG. 15, the interior angle 116 of a sidewall of the third chip 240 to the bonding interface between the third chip 240 and the second chip back side interconnect structure 230 is present in the bonded structure. As previously discussed, the singulation etch process can cause a sidewall of the third chip 240 to be non-vertical, which in turn, can cause the interior angle 116 to be present between that non-vertical sidewall and the bonding interface between the third chip 240 and the second chip back side interconnect structure 230.

Figure 16:
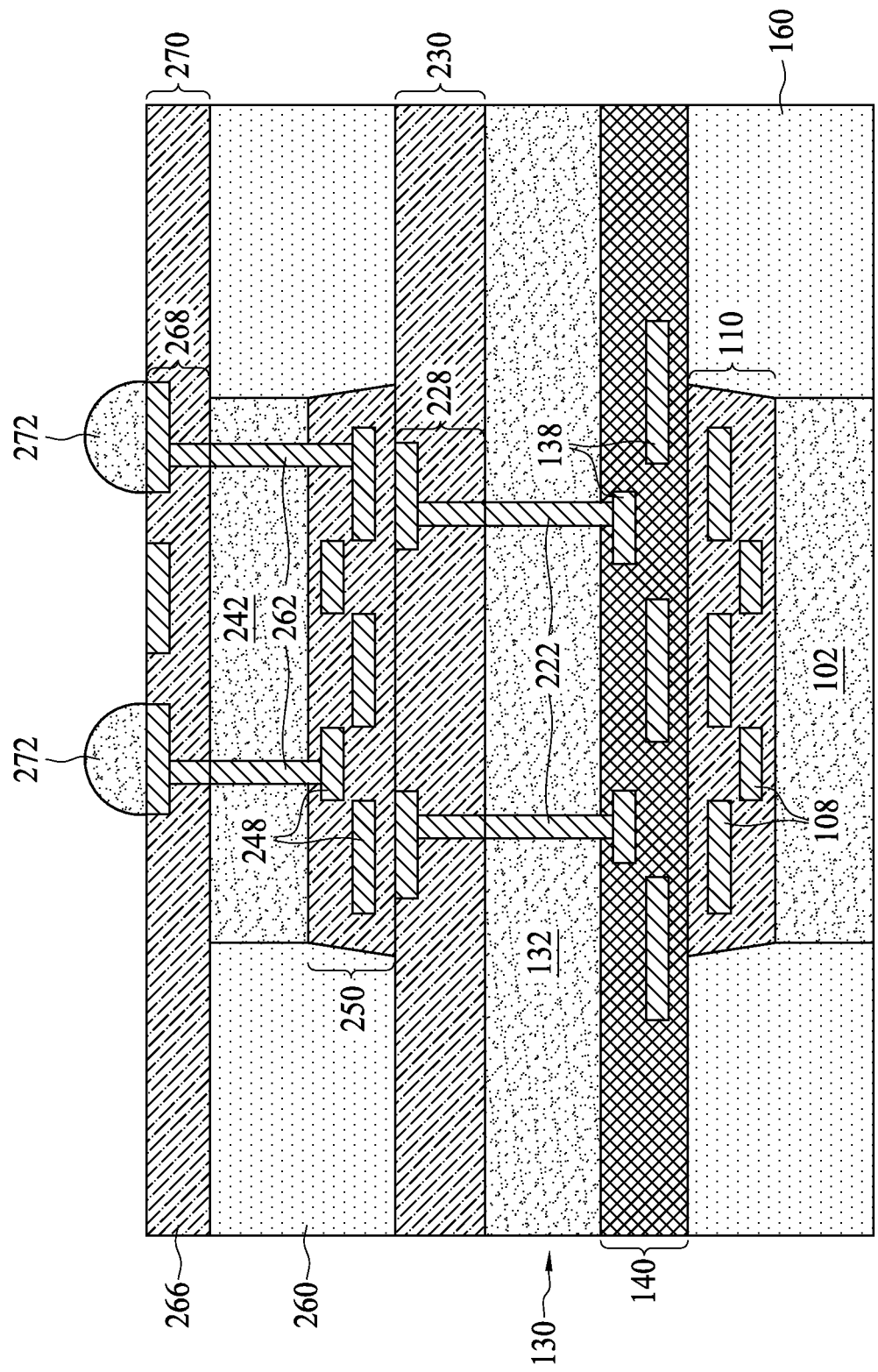

With reference to FIG. 16, the third chip 240 is encapsulated with an encapsulant 260 on the second chip back side interconnect structure 230, such as while the second chip 130 is part of the larger substrate. The encapsulant 260 can be as discussed above with respect to the encapsulant 160 in FIG. 9. Through vias 262 and a first chip stack interconnect structure 270 with one or more dielectric layer 266 and metallization pattern 268 are formed. The through vias 262 are through the third semiconductor substrate 242. An electrical connection is formed extending from the back side of the third semiconductor substrate 242 to one or more of the metallization patterns 248 and/or 228. The through vias 162 can be formed using processes as discussed above with respect to the formation of through vias 144 in FIG. 8. The metallization patterns 268 of the first chip stack interconnect structure 270 are connected to the through vias 262 to provide electrical connections from the first chip stack interconnect structure 270 to the first chip 100, the second chip 130, and the third chip 240. The first chip stack interconnect structure 270 can be formed using processes as discussed above with respect to the first chip stack interconnect structure 170 in FIG. 10. Contact bumps 272 are formed on the first chip stack interconnect structure 270 electrically coupled to the metallization patterns 268. The contact bumps 272, with any UBMs, can be formed as discussed above with respect to the formation of contact bumps 152, and UBMs, respectively, in FIG. 8.

After the processing illustrated in FIG. 16, a detach process can be performed to remove the carrier substrate 214 and the release layer 216, and a singulation process can be performed to singulate the chip stack 100/130/240 from the larger substrate of the second semiconductor substrate 132. In some embodiments, the singulation process can be an etch singulation process similar to the process discussed above with respect to FIGS. 2 through 5. In other embodiments, the singulation process can use a sawing process, while in further embodiments, the singulation process can be a combination sawing and etching singulation process.

Figure 17:
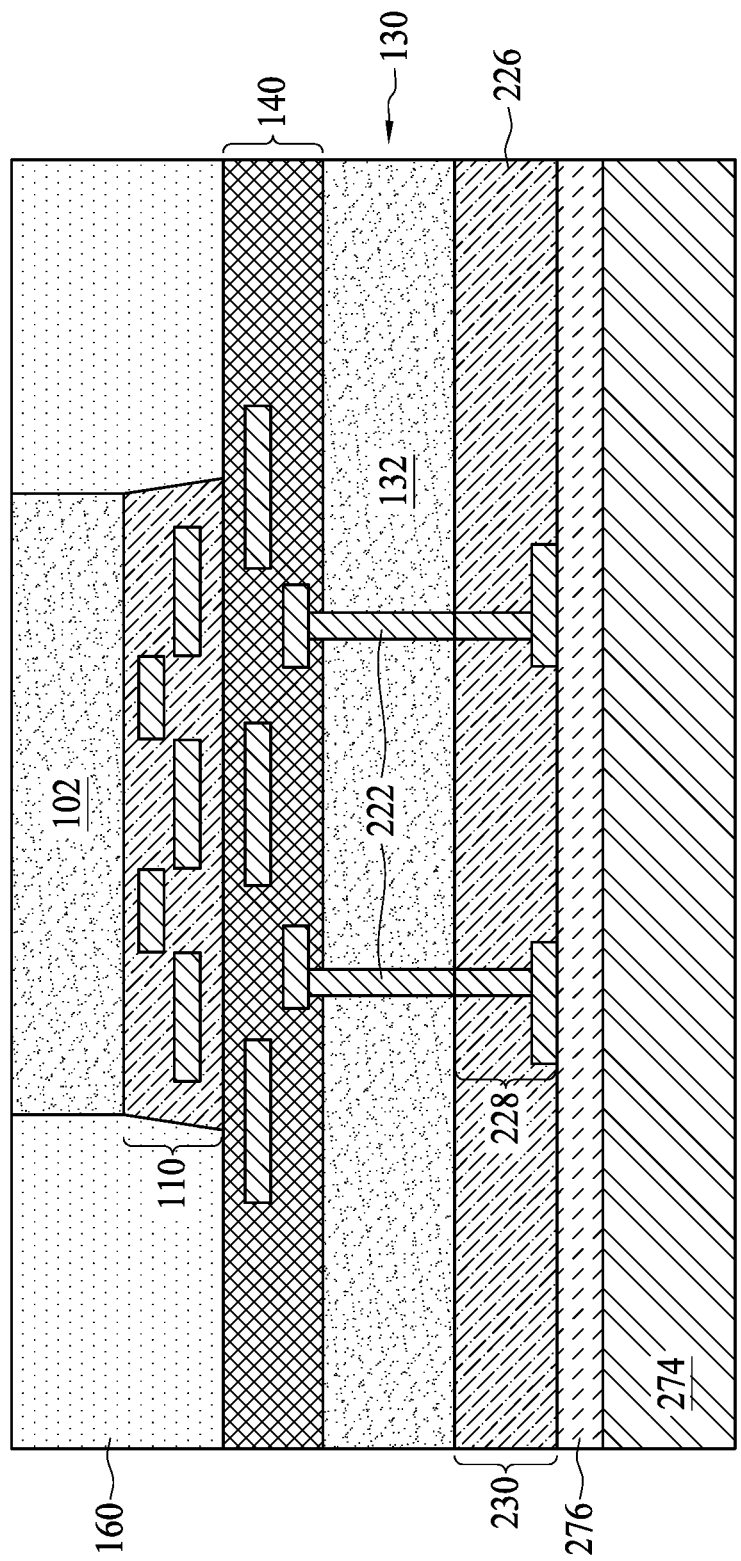
FIGS. 17 through 22 are various cross-sectional views of structures in intermediate steps of a fifth embodiment wherein a chip(s) is singulated and bonded to a larger substrate.

FIGS. 1 through 6, 9, 14, and 17 through 22 illustrate various cross-sectional views of structures in intermediate steps of a fifth embodiment wherein a chip(s) is singulated and bonded to a larger substrate, e.g., a wafer. Processing proceeds as discussed above with respect to FIGS. 1 through 6, 9, and 14. With reference to FIG. 17, the carrier substrate 214 is detached from the first chip 100 and the encapsulant 160, and then, the second chip back side interconnect structure 230 of the second chip 130, such as while a part of the larger substrate, is adhered to a carrier substrate 274 by a release layer 276. The carrier substrate 214 and release layer 216 may be as discussed with respect to the carrier substrate 112 and release layer 114, respectively, in FIG. 2.

Figure 18:
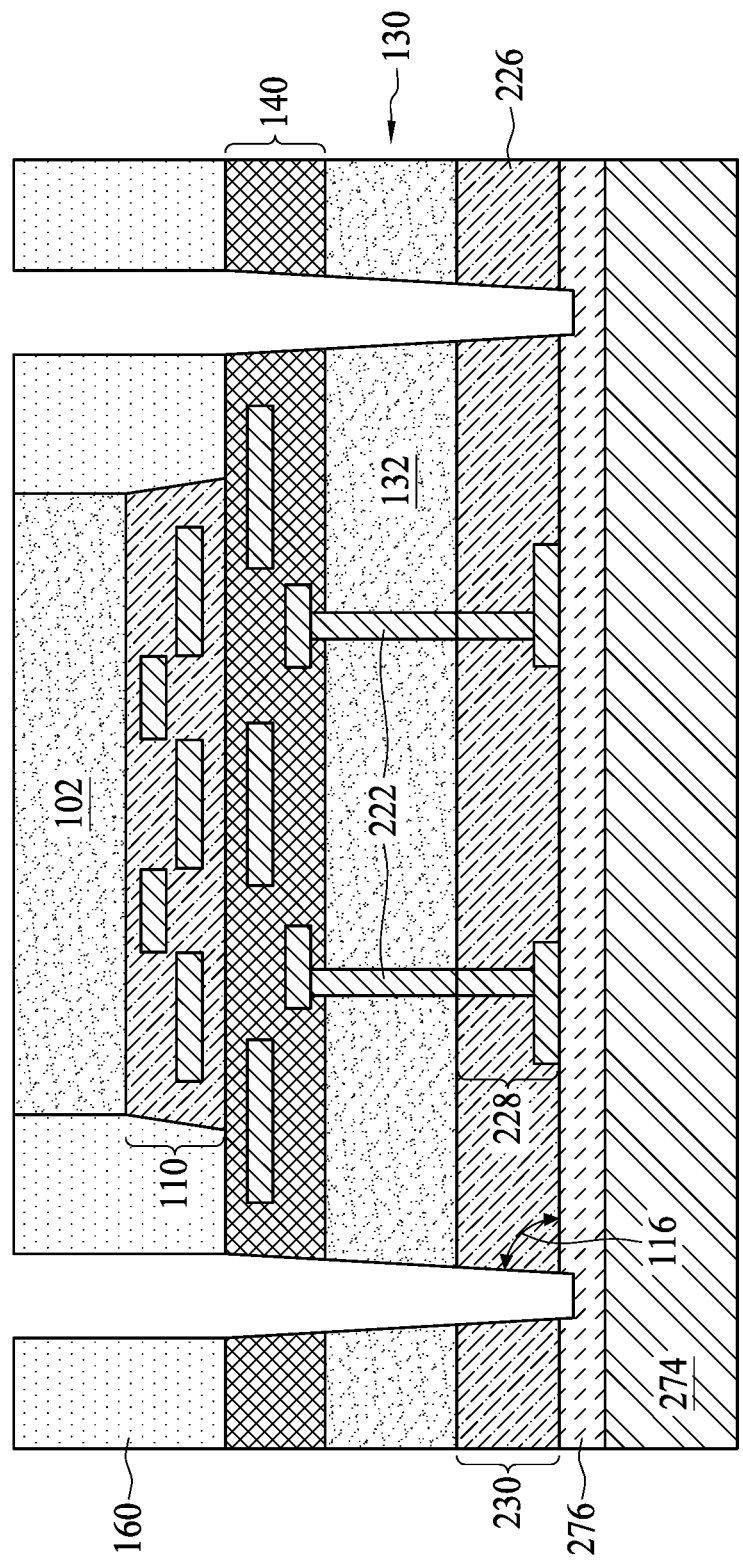

With reference to FIG. 18, while the second chip 130, as part of the larger substrate, is adhered to the carrier substrate 274, an etch singulation process is performed through the encapsulant 160, the second chip front side interconnect structure 140, the second semiconductor substrate 132, and the second chip back side interconnect structure 230 to singulate the chip stack 100/130 from the larger substrate and/or other chips. The etch singulation process can use photolithography and etching techniques. The etch singulation process can include depositing, exposing to light, and developing a photoresist on the back side of the first semiconductor substrate 102 and the encapsulant 160. This process patterns the photoresist on the back side of the first semiconductor substrate 102 and the encapsulant 160. The pattern formed in the photoresist exposes singulation regions outside the periphery of the first chip 100 and on the encapsulant 160 that are to be etched to thereby singulate the second chip 130 and/or similar chips from the larger substrate. An etch process can then be performed through the patterned photoresist. The etch process can be anisotropic, such as a DRIE, an ICP etch, a CCP etch, the like, or a combination thereof. The etch process etches through the singulation regions through the encapsulant 160, the second chip front side interconnect structure 140, the second semiconductor substrate 132, and the second chip back side interconnect structure 230. After the etch process is completed, a chip stack including the second chip 130 and the first chip 100, and/or other similar chip stacks are singulated. Various layers may be present on the first semiconductor substrate 102 and the encapsulant 160 during the etch process, such as hardmask layer(s), ARC layer(s), the like, or a combination thereof.

The etch process can result in sidewalls of the chip stack 100/130 that are vertical, non-vertical, or a combination thereof. For example, a sidewall of the second chip 130 at and/or proximate the second chip back side interconnect structure 230 can be non-vertical, while a sidewall of proximate the first chip 100 (e.g., encapsulant 160) can be vertical. As illustrated a sidewall of the second chip back side interconnect structure 230 of the second chip 130 is non-vertical. An interior angle 116 between the sidewall of the second chip back side interconnect structure 230 of the second chip 130 and an exterior surface of the second chip back side interconnect structure 230 of the second chip 130 distal from the second semiconductor substrate 132 is less than 90°, which interior angle 116 may further be between about 89° and about 60°, and more particularly, may be between about 88° and about 80°.

The etch singulation process discussed with respect to FIG. 18 can allow for more flexibility of a layout shape of the second chip 130. For example, including allowing for a rectangular layout shape of the second chip 130, a layout shape of the second chip 130 could be hexagonal, octagonal, circular, ovaloid, another polygonal shape, or the like.

Figure 19:
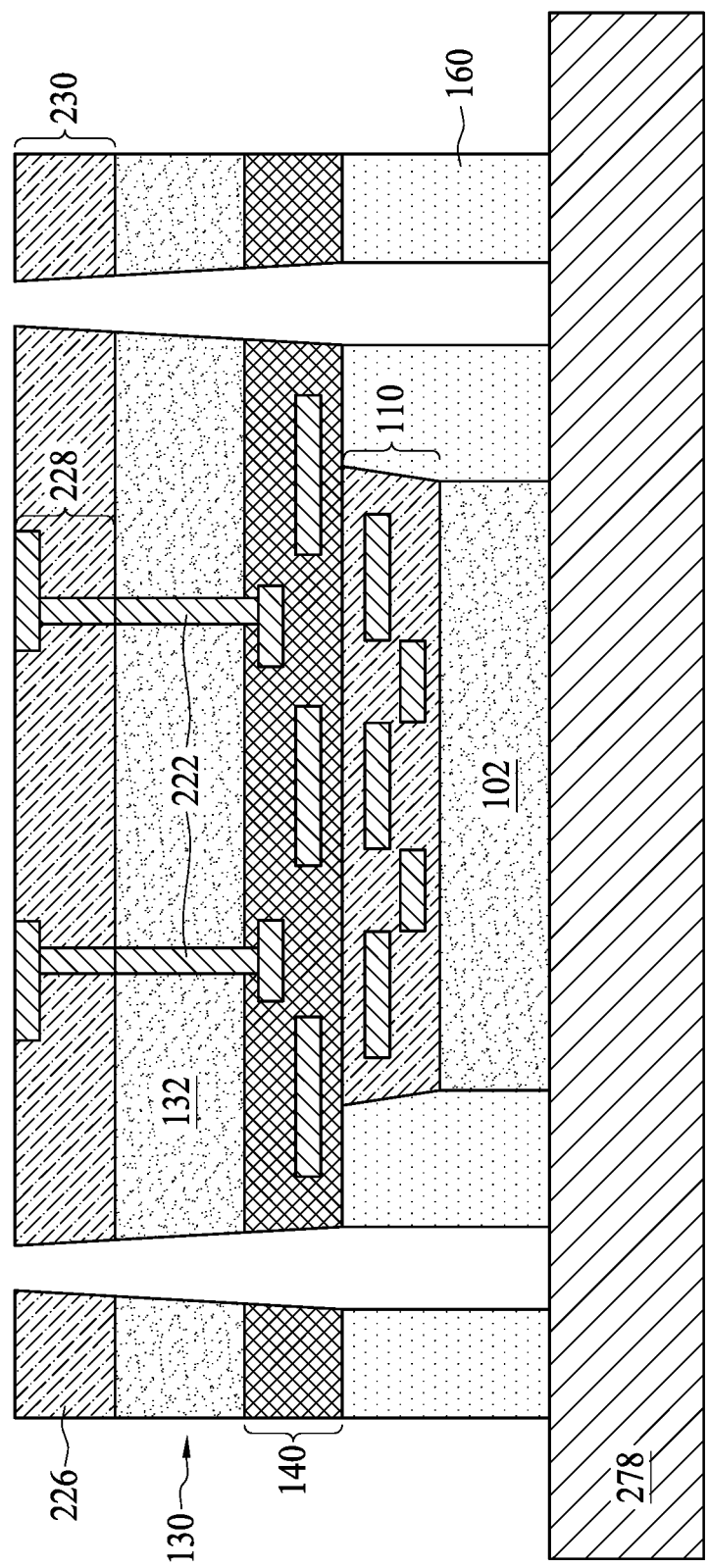

Referring to FIG. 19, the singulated chip stack 100/130, while still adhered to the carrier substrate 274, is flipped over and attached to a dicing tape 278. A carrier substrate detach process is performed to detach the carrier substrate 274 from the second chip 130, e.g., from the second chip back side interconnect structure 230. In accordance with some embodiments, the de-bonding includes projecting a light such as a laser light or an UV light on the release layer 276 so that the release layer 276 decomposes under the heat of the light and the carrier substrate 274 can be removed. A cleaning process may be performed to remove residue of the release layer 276 remaining on the second chip 130 after the detach process.

Figure 20:
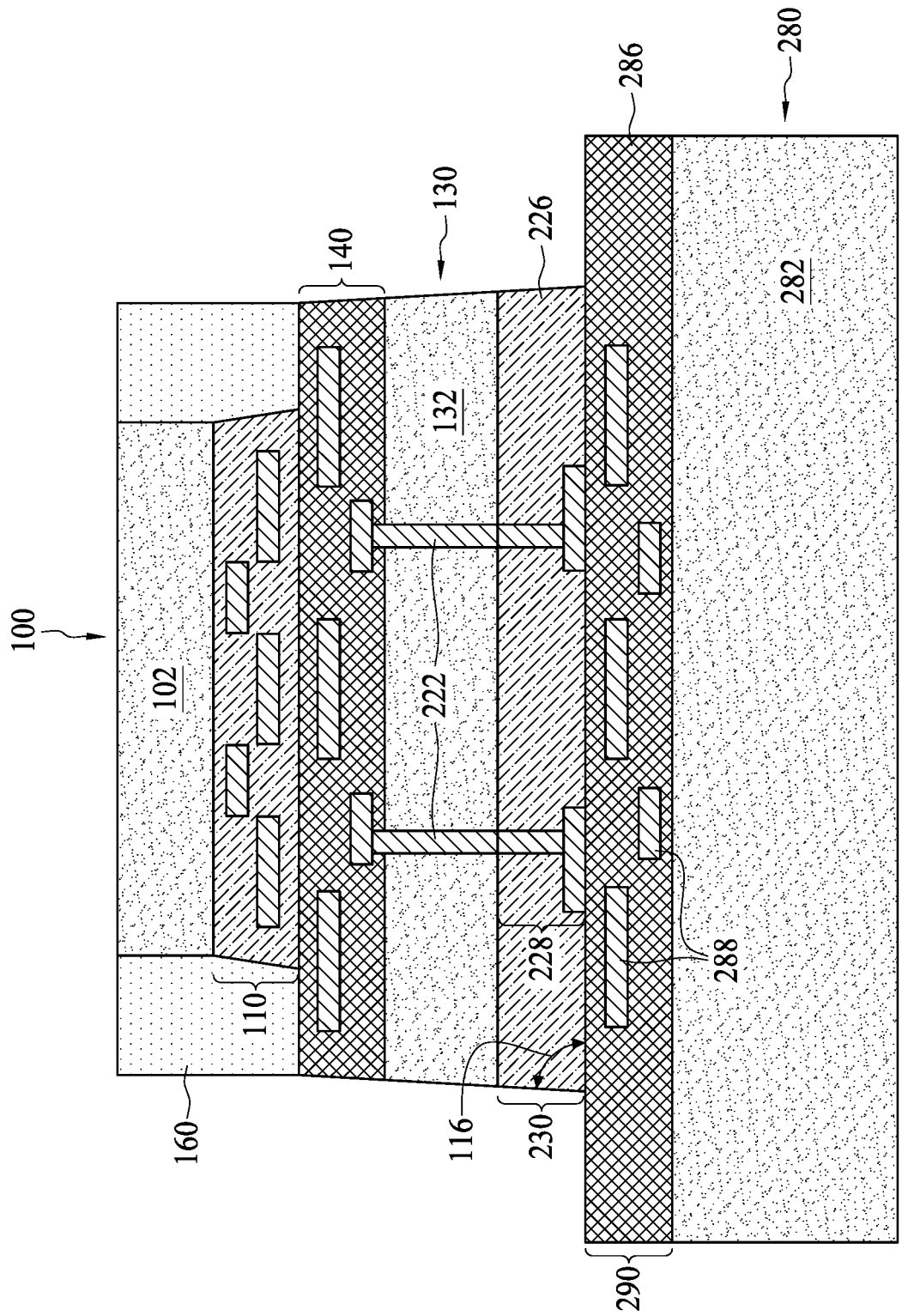

Referring to FIG. 20, a third integrated circuit chip (or more simply, "chip") 280 is shown prior to a singulation. Much of the discussion of the first chip 100 in FIG. 1 is applicable to the third chip 280 in FIG. 20. One of ordinary skill in the art will readily understand the correspondence of features and discussion between the first chip 100 and the third chip 280, and therefore, some discussion of features of the third chip 280 is omitted herein for brevity. The third chip 280 includes a third semiconductor substrate 282 having a third electrical circuit and has a third chip front side interconnect structure 290 having one or more dielectric layer 286 with a respective metallization pattern 288. The third electrical circuitry may include memory structures, data processing structures, sensors, amplifiers, power distribution, input/output circuitry, or the like.

Referring further to FIG. 20, the chip stack 100/130 is bonded to the third chip 280, such as while the third chip 280 is part of a larger substrate, e.g., a wafer. Hence, FIG. 20 can depict CoW bonding. The chip stack 100/130 may be removed from the dicing tape 278 and aligned over the third chip 280 using a pick-and-place tool. The chip stack 100/130 is then contacted with the third chip 280, and bonding occurs. As illustrated, the second chip back side interconnect structure 230 of the second chip 130 is bonded to the third chip front side interconnect structure 290 of the third chip 280. The bonding may include bonding one dielectric layer 226 of the second chip 130 that is most distal from the second semiconductor substrate 132 to one dielectric layer 286 of the third chip 280 that is most distal from the third semiconductor substrate 282. The bonding may further include bonding a metallization pattern 228 of the second chip 130 that is most distal from the second semiconductor substrate 132 to a metallization pattern 288 of the third chip 280 that is most distal from the third semiconductor substrate 282. Further, the bonding may include bonding a dielectric layer 226 of the second chip 130 to a metallization pattern 288 of the third chip 280, and/or a metallization pattern 228 of the second chip 130 to a dielectric layer 286 of the third chip 280. Hence, bonding can include dielectric-to-dielectric bonding, metal-to-metal bonding, metal-to-dielectric bonding, and/or the like. In some instances, metal-to-metal bonding allows electrical interconnections between the first chip 100, the second chip 130, and the third chip 280.

As further shown in FIG. 20, the interior angle 116 of a sidewall of the second chip 130 to the bonding interface between the second chip 130 and the third chip 280 is present in the bonded structure. As previously discussed, the singulation etch process can cause a sidewall of the second chip 130 to be non-vertical, which in turn, can cause the interior angle 116 to be present between that non-vertical sidewall and the bonding interface between the second chip 130 and the third chip 280.

Figure 21:
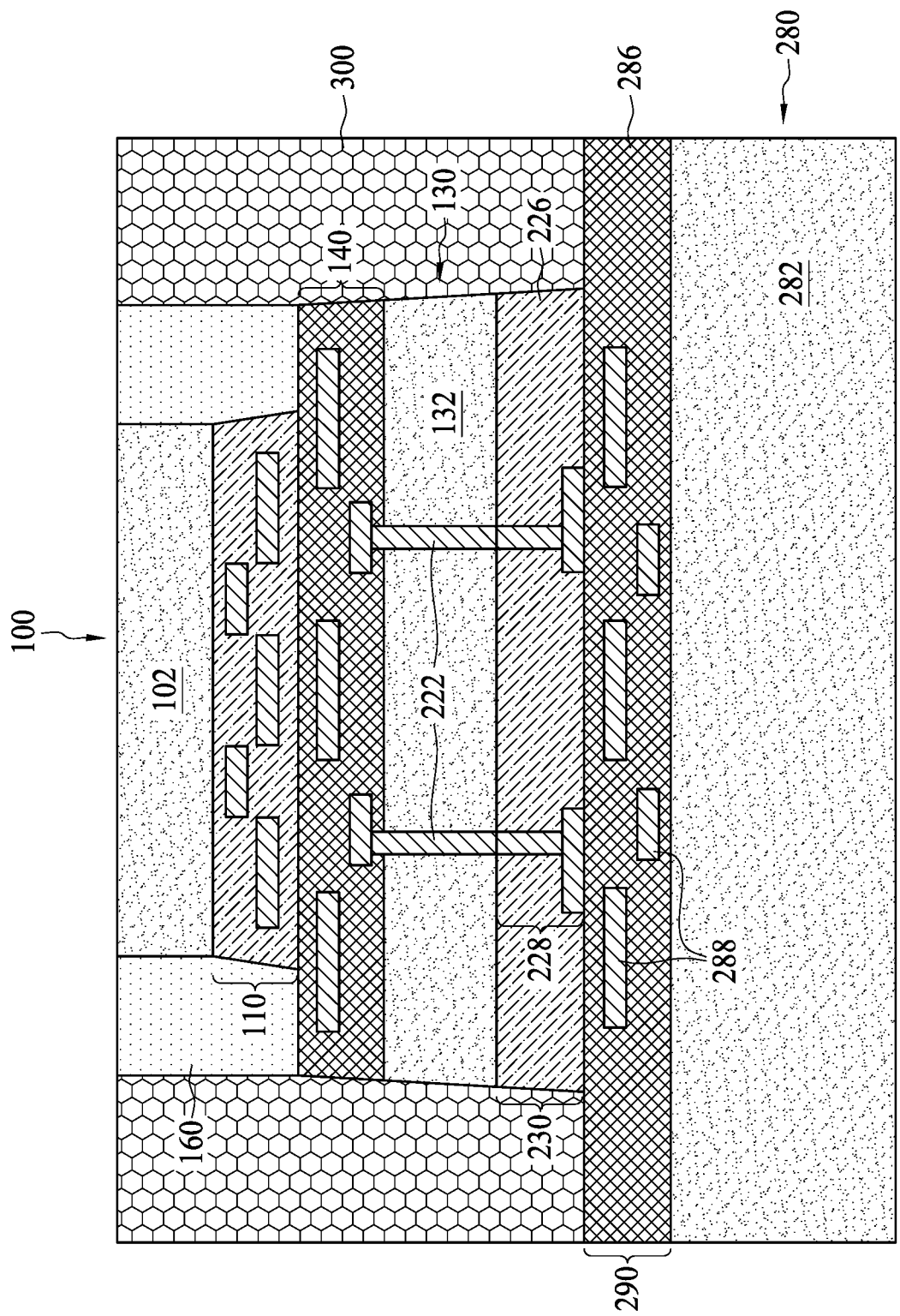

With reference to FIG. 21, the chip stack 100/130 is encapsulated with an encapsulant 300 on the third chip 280, such as while the third chip 280 is part of the larger substrate. The encapsulant 300 can be a molding compound, epoxy, resin, or the like, and can be formed encapsulating the chip stack 100/130 using compression molding, transfer molding, or the like.

Figure 22:
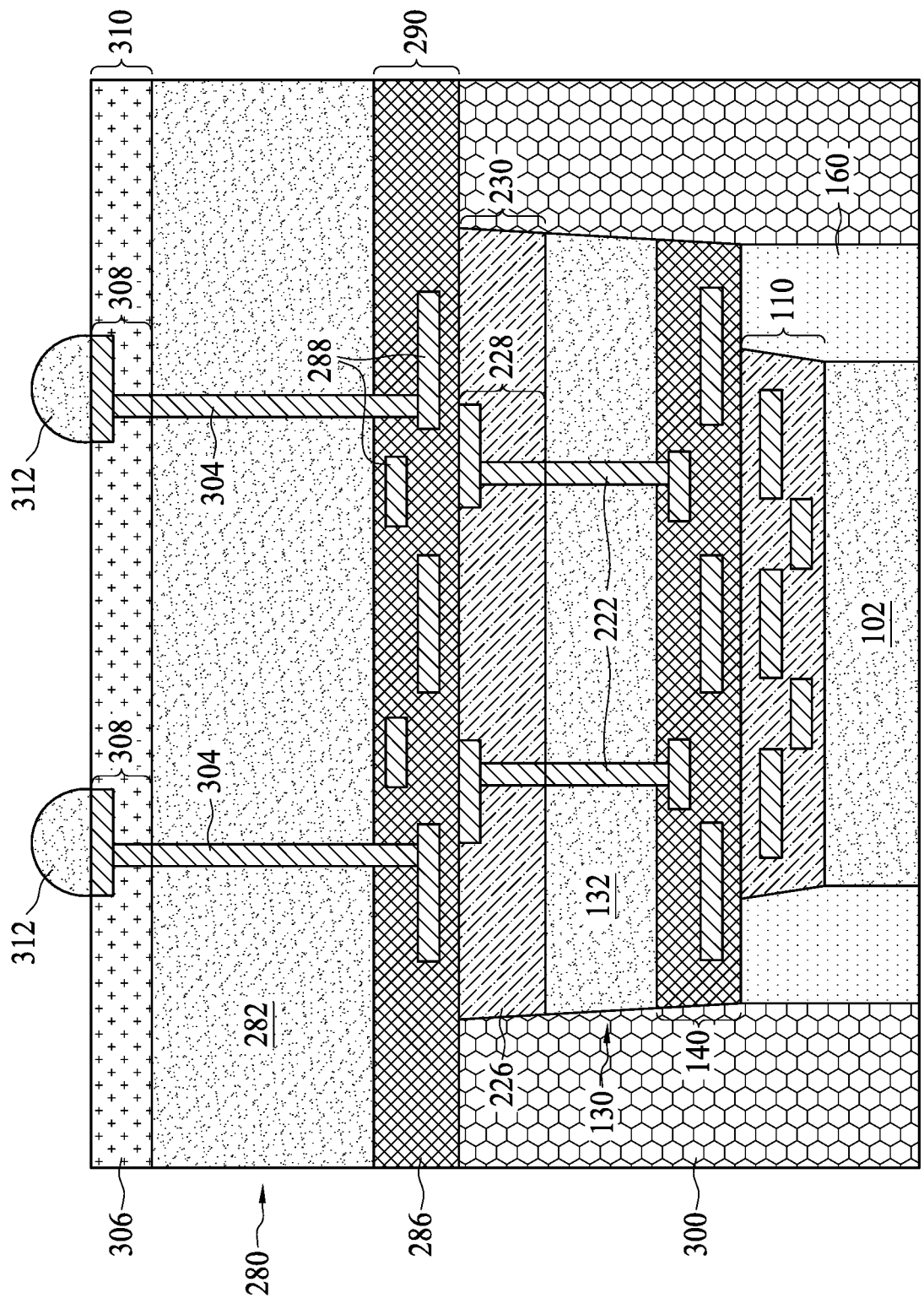

With reference to FIG. 22, processing on the back side of the third semiconductor substrate 282 is performed. Such processing can include thinning the third semiconductor substrate 282. The thinning process can be as discussed with respect to FIG. 8. Thereafter, through vias 304 and a third chip back side interconnect structure 310 having one or more dielectric layer 306 with a respective metallization pattern 308 are formed. The process for forming the through vias 304 and the third chip back side interconnect structure 310 having various dielectric layers 306 and metallization patterns 308 can be as discussed with respect to the through vias 144 and second chip back side interconnect structure 150 in FIG. 8. The through vias 304 are through the third semiconductor substrate 282. An electrical connection is formed extending from the back side of the third semiconductor substrate 282 to one or more of the metallization patterns 288 and/or 228. The metallization pattern(s) 308 can be connected to the through vias 304. Contact bumps 312 are formed on the third chip back side interconnect structure 310 electrically coupled to the metallization patterns 308. The contact bumps 312, with any UBMs, can be formed as discussed above with respect to the formation of contact bumps 152, and UBMs, respectively, in FIG. 8.

After the processing illustrated in FIG. 22, a singulation process can be performed to singulate the chip stack 100/130/280 from the larger substrate of the third semiconductor substrate 282. In some embodiments, the singulation process can be an etch singulation process similar to the process discussed above with respect to FIGS. 2 through 5. In other embodiments, the singulation process can use a sawing process, while in further embodiments, the singulation process can be a combination sawing and etching singulation process.

Figure 23:
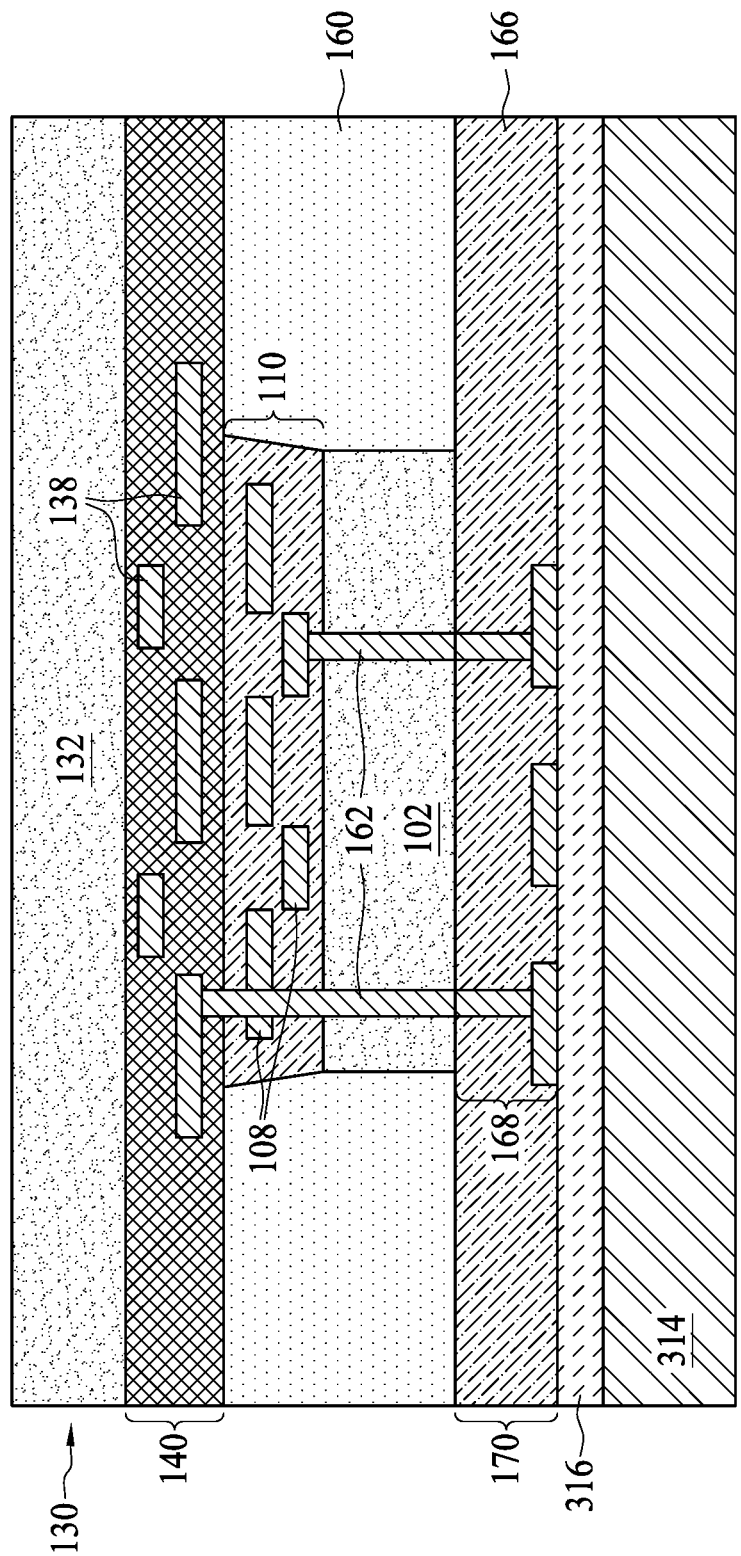
FIGS. 23 through 28 are various cross-sectional views of structures in intermediate steps of a sixth embodiment wherein a chip(s) is singulated and bonded to a larger substrate.

FIGS. 1 through 6, 9, 10, and 23 through 28 illustrate various cross-sectional views of structures in intermediate steps of a sixth embodiment wherein a chip(s) is singulated and bonded to a larger substrate, e.g., a wafer. Processing proceeds as discussed above with respect to FIGS. 1 through 6, 9, and 10. With reference to FIG. 23, processing on the back side of the second semiconductor substrate 132 is performed. The first chip 100, as encapsulated in the encapsulant 160 and with the first chip stack interconnect structure 170, is adhered to a carrier substrate 314 by a release layer 316. The release layer 316 adheres the first chip stack interconnect structure 170 to the carrier substrate 314. The carrier substrate 314 and release layer 316 may be as discussed with respect to the carrier substrate 112 and release layer 114, respectively, in FIG. 2.

Once the first chip 100 is adhered to the carrier substrate 314, the second semiconductor substrate 132 may be thinned. The thinning process can thin the second semiconductor substrate 132 from the back side of the second semiconductor substrate 132. The thinning process can include a grinding process such as a CMP, an etch-back process, the like, or a combination thereof. In some embodiments, before thinning the second semiconductor substrate 132, the thickness of the second chip 130 (e.g., a combined thickness of the second semiconductor substrate 132 and the second chip front side interconnect structure 140) can be approximately 300 μm or greater, and after thinning the second semiconductor substrate 132, the thickness can be approximately 5 μm or greater, for example, between about 5 μm and about 20 μm.

Figure 24:
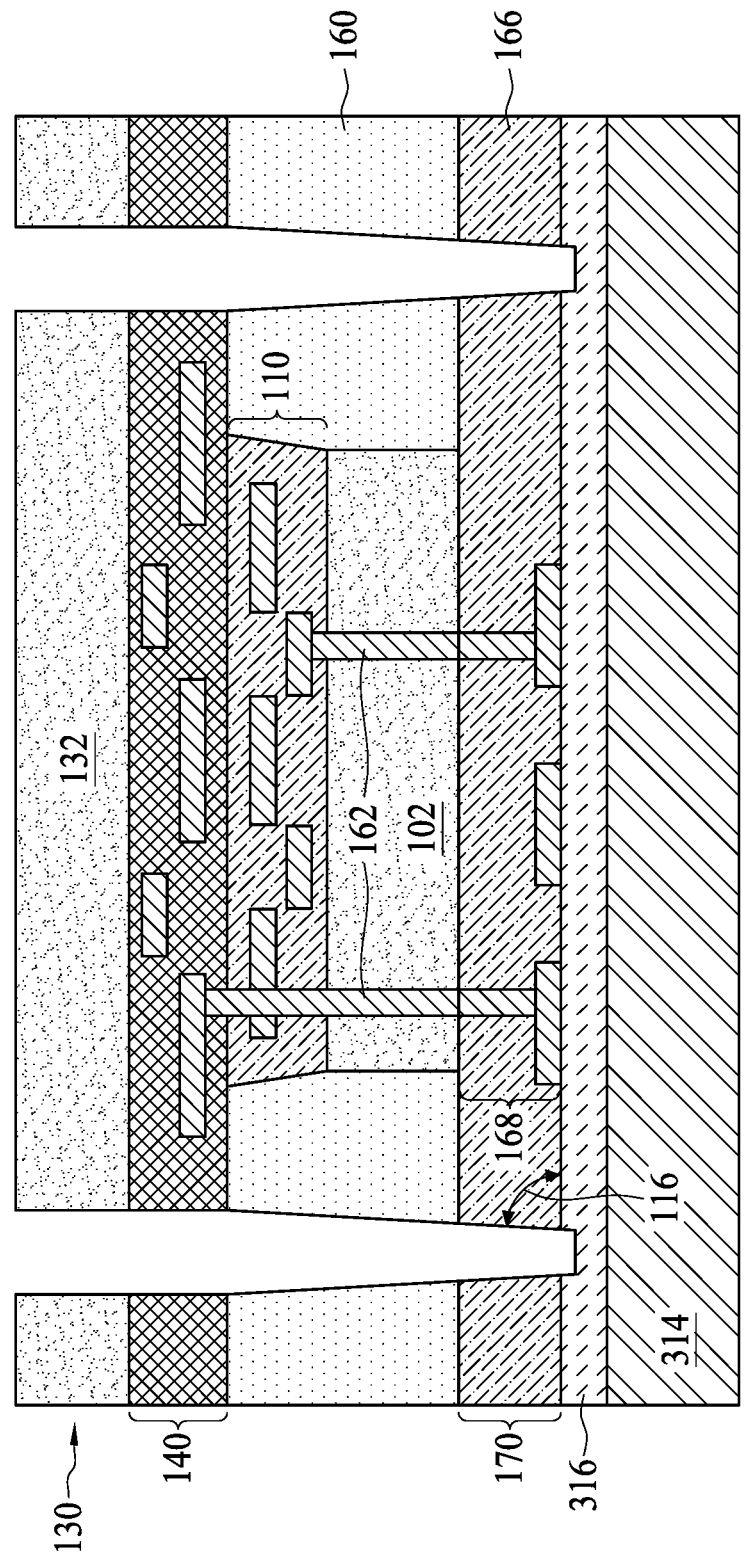

With reference to FIG. 24, while the first chip 100 is adhered to the carrier substrate 274 and the second chip 130 remains part of a larger substrate, an etch singulation process is performed through the back side of the second semiconductor substrate 132 to singulate the chip stack 100/130, from the larger substrate and/or other chips. The etch singulation process can use photolithography and etching techniques. The etch singulation process can include depositing, exposing to light, and developing a photoresist on the back side of the second semiconductor substrate 132. This process patterns the photoresist on the back side of the second semiconductor substrate 132. The pattern formed in the photoresist exposes singulation regions outside the periphery of the second chip 130 that are to be etched to thereby singulate the second chip 130 and/or similar chips from the larger substrate. An etch process can then be performed through the patterned photoresist. The etch process can be anisotropic, such as a DRIE, an ICP etch, a CCP etch, the like, or a combination thereof. The etch process etches through the singulation regions through the second semiconductor substrate 132, the second chip front side interconnect structure 140, the encapsulant 160, and the first chip stack interconnect structure 170. After the etch process is completed, a chip stack including the second chip 130 and the first chip 100, and/or other similar chip stacks are singulated. Various layers may be present on the second semiconductor substrate 132 during the etch process, such as hardmask layer(s), ARC layer(s), the like, or a combination thereof.

The etch process can result in sidewalls of the chip stack 100/130 that are vertical, non-vertical, or a combination thereof. For example, a sidewall of the second chip 130 at and/or proximate the second semiconductor substrate 132 can be vertical, while a sidewall of the first chip stack interconnect structure 170 and/or the encapsulant 160 can be non-vertical. As illustrated a sidewall of the first chip stack interconnect structure 170 and the encapsulant 160 is non-vertical. An interior angle 116 between the sidewall of the first chip stack interconnect structure 170 and an exterior surface of the first chip stack interconnect structure 170 distal from the first semiconductor substrate 102 is less than 90°, which interior angle 116 may further be between about 89° and about 60°, and more particularly, may be between about 88° and about 80°.

The etch singulation process discussed with respect to FIG. 24 can allow for more flexibility of a layout shape of the second chip 130. For example, including allowing for a rectangular layout shape of the second chip 130, a layout shape of the second chip 130 could be hexagonal, octagonal, circular, ovaloid, another polygonal shape, or the like.

Figure 25:
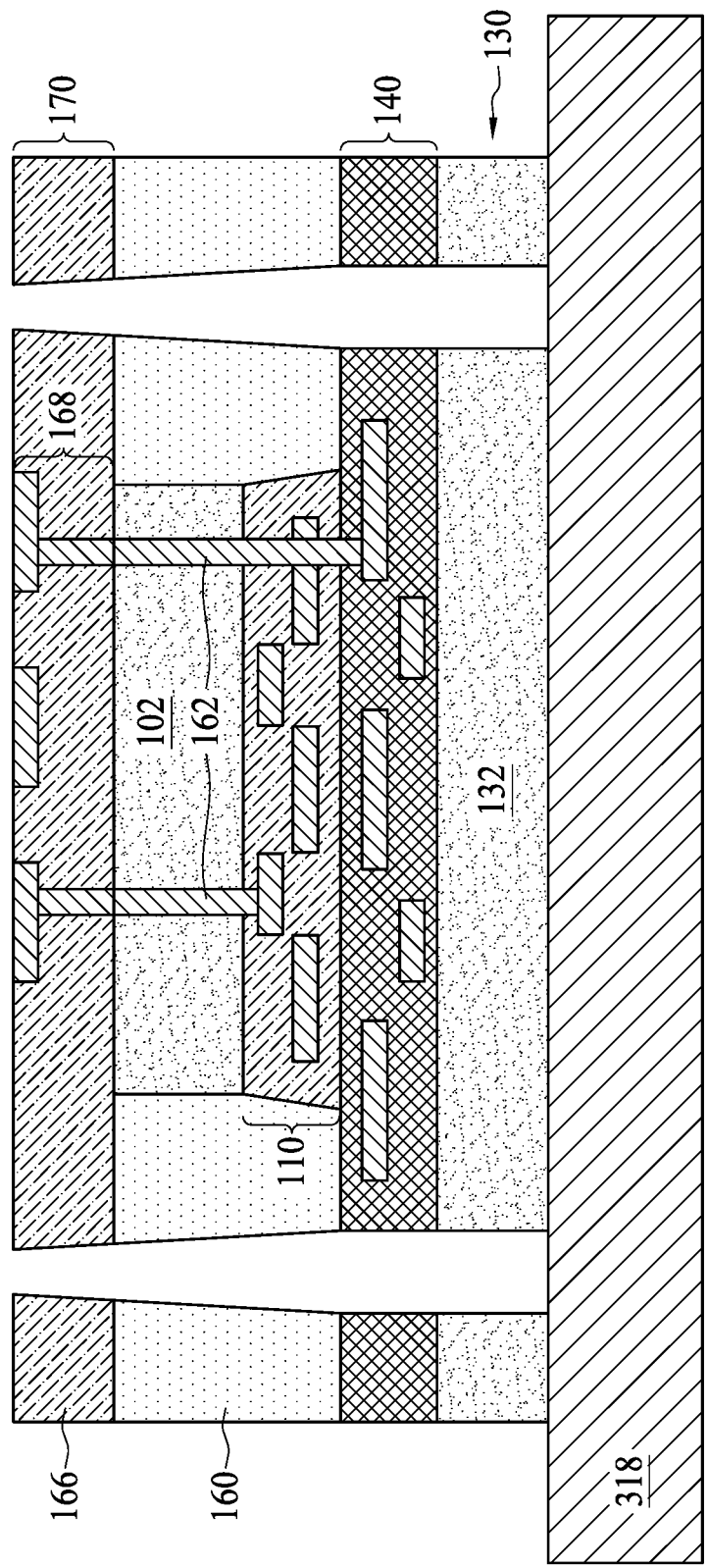

Referring to FIG. 25, the singulated chip stack including the first chip 100 and the second chip 130, while still adhered to the carrier substrate 314, is flipped over and attached to a dicing tape 318. A carrier substrate detach process is performed to detach the carrier substrate 314 from the first chip stack interconnect structure 170.

Figure 26:
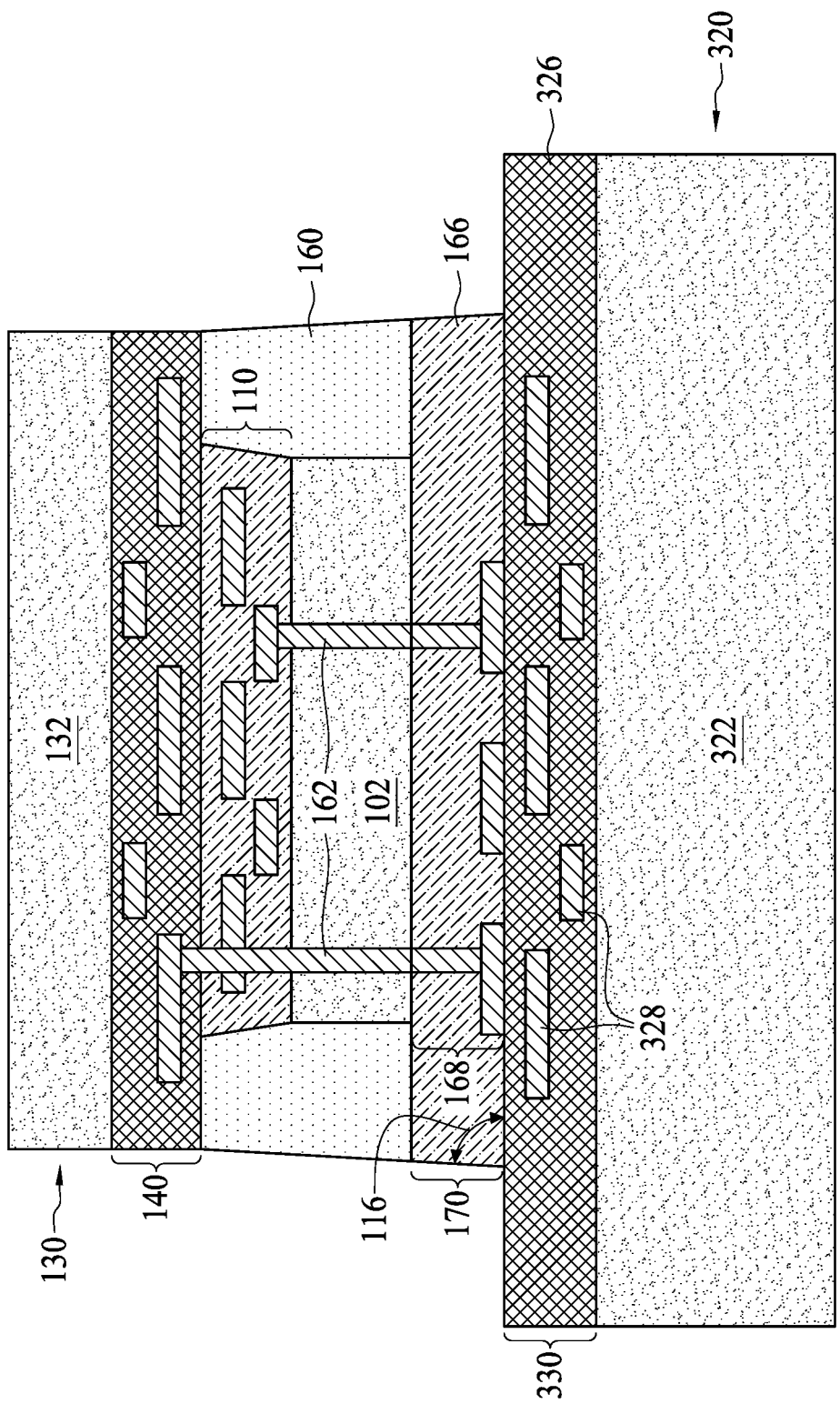

Referring to FIG. 26, a third integrated circuit chip (or more simply, "chip") 320 is shown prior to a singulation. Much of the discussion of the first chip 100 in FIG. 1 is applicable to the third chip 320 in FIG. 26. One of ordinary skill in the art will readily understand the correspondence of features and discussion between the first chip 100 and the third chip 320, and therefore, some discussion of features of the third chip 320 is omitted herein for brevity. The third chip 320 includes a third semiconductor substrate 322 having a third electrical circuit and has a third chip back side interconnect structure 350 having one or more dielectric layer 326 with a respective metallization pattern 328. The third electrical circuitry may include memory structures, data processing structures, sensors, amplifiers, power distribution, input/output circuitry, or the like.

Referring further to FIG. 26, the chip stack 100/130 is then bonded to the third chip 320, such as while the third chip 320 is part of a larger substrate, e.g., a wafer. Hence, FIG. 26 can depict CoW bonding. The chip stack 100/130 may be removed from the dicing tape 318 and aligned over the third chip 320 using a pick-and-place tool. The chip stack 100/130 is then contacted with the third chip 320, and bonding occurs. As illustrated, the first chip stack interconnect structure 170 is bonded to the third chip front side interconnect structure 330 of the third chip 320. The bonding may include bonding one dielectric layer 166 of the first chip stack interconnect structure 170 that is most distal from the first semiconductor substrate 102 to one dielectric layer 326 of the third chip 320 that is most distal from the third semiconductor substrate 322. The bonding may further include bonding a metallization pattern 168 of the first chip stack interconnect structure 170 that is most distal from the first semiconductor substrate 102 to a metallization pattern 328 of the third chip 320 that is most distal from the third semiconductor substrate 322. Further, the bonding may include bonding a dielectric layer 166 of the first chip stack interconnect structure 170 to a metallization pattern 328 of the third chip 320, and/or a metallization pattern 168 of the first chip stack interconnect structure 170 to a dielectric layer 326 of the third chip 320. Hence, bonding can include dielectric-to-dielectric bonding, metal-to-metal bonding, metal-to-dielectric bonding, and/or the like. In some instances, metal-to-metal bonding allows electrical interconnections between the first chip 100, the second chip 130, and the third chip 320.

As further shown in FIG. 26, the interior angle 116 of a sidewall of the first chip stack interconnect structure 170 to the bonding interface between the first chip stack interconnect structure 170 and the third chip 320 is present in the bonded structure. As previously discussed, the singulation etch process can cause a sidewall of the first chip stack interconnect structure 170 to be non-vertical, which in turn, can cause the interior angle 116 to be present between that non-vertical sidewall and the bonding interface between the first chip stack interconnect structure 170 and the third chip 320.

Figure 27:
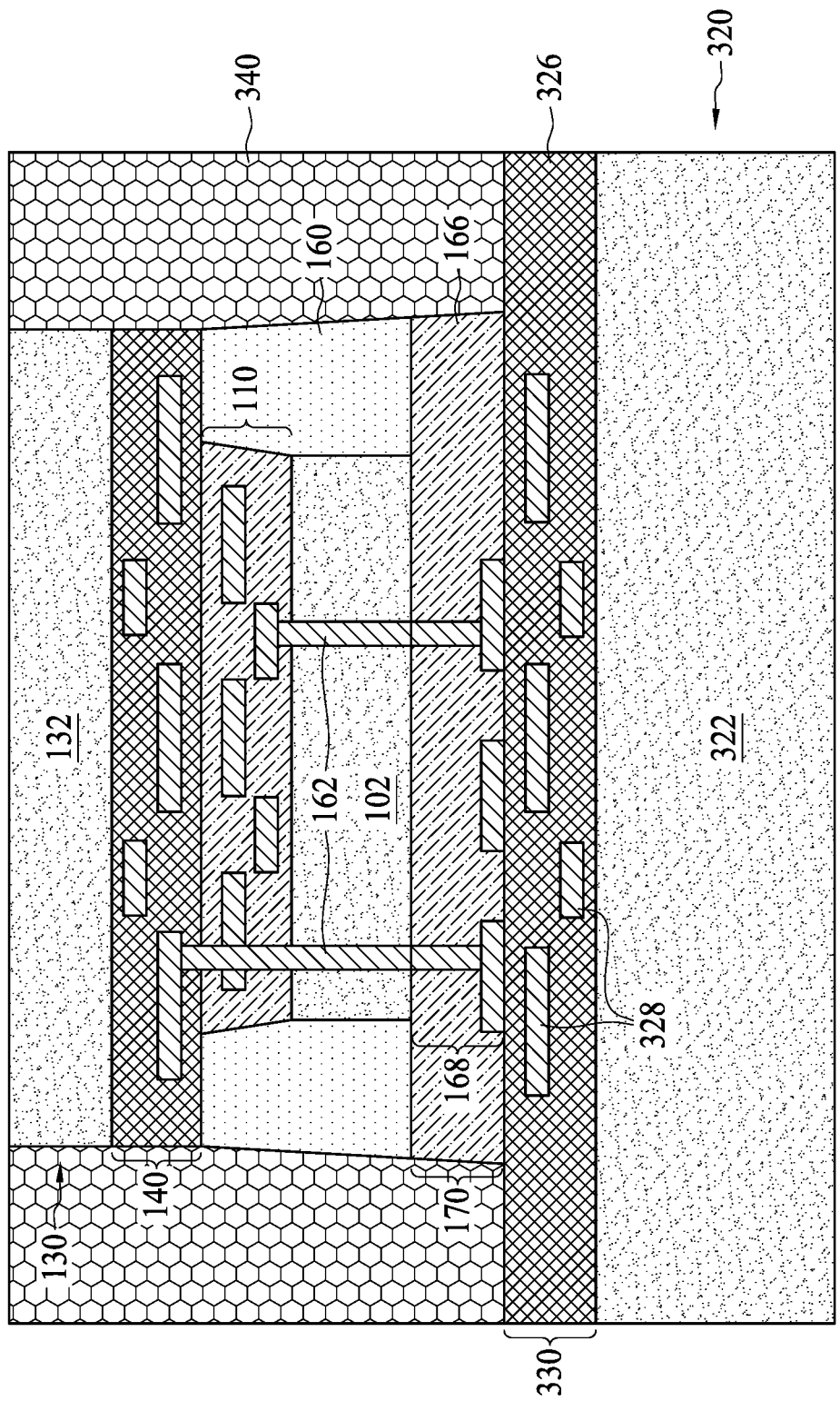

With reference to FIG. 27, the chip stack 100/130 is encapsulated with an encapsulant 340 on the third chip 320, such as while the third chip 320 is part of a larger substrate. The encapsulant 340 can be a molding compound, epoxy, resin, or the like, and can be formed encapsulating the chip stack 100/130 using compression molding, transfer molding, or the like.

Figure 28:
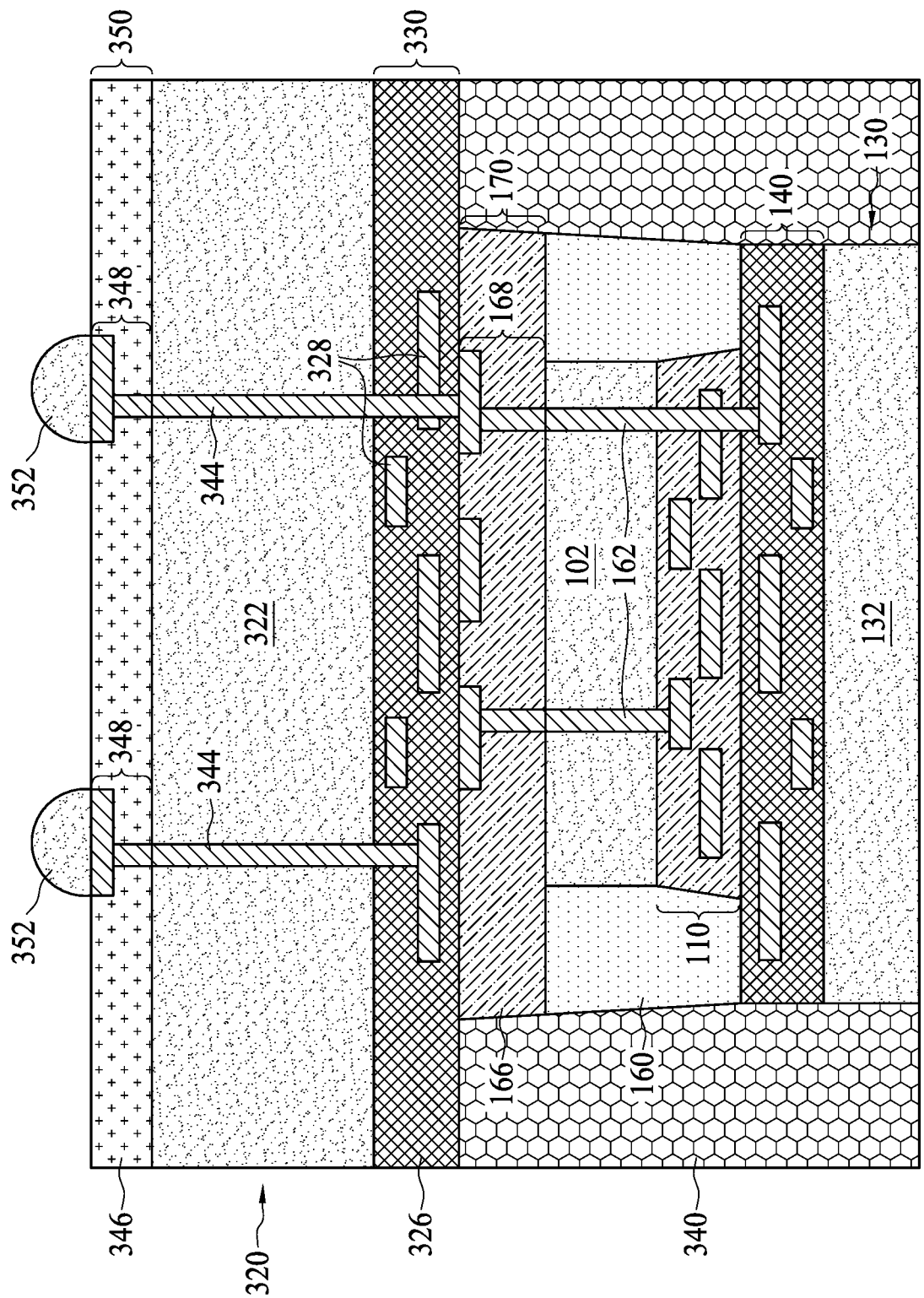

With reference to FIG. 28, processing on the back side of the third semiconductor substrate 322 is performed. Such processing can include thinning the third semiconductor substrate 322. The thinning process can be as discussed with respect to FIG. 8. Thereafter, through vias 344 and a third chip back side interconnect structure 350 having one or more dielectric layer 346 with a respective metallization pattern 348 are formed. The process for forming the through vias 344 and the third chip back side interconnect structure 350 having various dielectric layers 346 and metallization patterns 348 can be as discussed with respect to the through vias 144 and second chip back side interconnect structure 150 in FIG. 8. The through vias 344 are through the third semiconductor substrate 322. An electrical connection is formed extending from the back side of the third semiconductor substrate 322 to one or more of the metallization patterns 328 and/or 168. The metallization pattern(s) 348 can be connected to the through vias 344. Contact bumps 352 are formed on the third chip back side interconnect structure 350 electrically coupled to the metallization patterns 348. The contact bumps 352, with any UBMs, can be formed as discussed above with respect to the formation of contact bumps 152, and UBMs, respectively, in FIG. 8.

After the processing illustrated in FIG. 28, a singulation process can be performed to singulate the chip stack 100/130/320 from the larger substrate of the third semiconductor substrate 322. In some embodiments, the singulation process can be an etch singulation process similar to the process discussed above with respect to FIGS. 2 through 5. In other embodiments, the singulation process can use a sawing process, while in further embodiments, the singulation process can be a combination sawing and etching singulation process.

Various other embodiments can employ different processing and sequence of processing. The following discussed embodiment illustrates some variations, and one of ordinary skill in the art will readily understand that these variations can be incorporated into other embodiments, such as the previously discussed embodiments, to varying extent. For example, a through via can be formed before bonding, as discussed subsequently.

Figure 29:
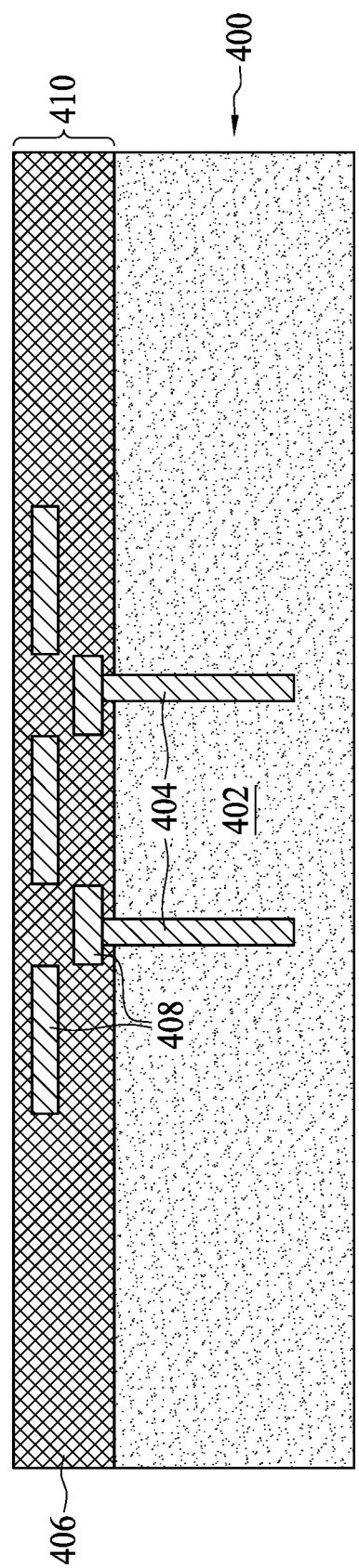
FIGS. 29 through 36 are various cross-sectional views of structures in intermediate steps of a seventh embodiment wherein a chip is singulated and bonded to a larger substrate.

FIGS. 29 through 36 illustrate various cross-sectional views of structures in intermediate steps of a seventh embodiment wherein a chip is singulated and bonded to a larger substrate, e.g., a wafer. Referring to FIG. 29, a first integrated circuit chip (or more simply, "chip") 400 is shown prior to a singulation. Much of the discussion of the first chip 100 in FIG. 1 is applicable to the first chip 400 in FIG. 29. One of ordinary skill in the art will readily understand the correspondence of features and discussion between the first chip 100 and the first chip 400, and therefore, some discussion of features of the first chip 400 is omitted herein for brevity. The first chip 400 includes a first semiconductor substrate 402 having first electrical circuitry and has a first chip front side interconnect structure 410 having one or more dielectric layer 406 with a respective metallization pattern 408. The first electrical circuitry may include memory structures, data processing structures, sensors, amplifiers, power distribution, input/output circuitry, or the like. The first semiconductor substrate 402 is part of a larger semiconductor substrate, such as a wafer, with other similar or same chips formed thereon before singulation.

The first chip 400 further includes through vias 404 in the first semiconductor substrate 402. The through vias 404 can be formed in the first semiconductor substrate 402 before the first chip front side interconnect structure 410 is formed or during the formation of the first chip front side interconnect structure 410. The through vias 404 can be formed by forming recesses in the first semiconductor substrate 402 by, for example, etching, milling, laser techniques, a combination thereof, and/or the like. A thin barrier layer is conformally deposited over the front side of the first semiconductor substrate 402 and in the openings, such as by CVD, atomic layer deposition (ALD), a combination thereof, and/or the like. The barrier layer may comprise a nitride or an oxynitride, such as titanium nitride, titanium oxynitride, tantalum nitride, tantalum oxynitride, a combination thereof, and/or the like. A conductive material is deposited over the thin barrier layer and in the openings. The conductive material may be formed by an electro-chemical plating process, CVD, ALD, a combination thereof, and/or the like. Examples of conductive materials are copper, tungsten, aluminum, silver, a combination thereof, and/or the like. Excess conductive material and barrier layer are removed from the front side of the first semiconductor substrate 402 by, for example, CMP. Thus, the through vias 404 can comprise a conductive material and a thin barrier layer between the conductive material and the first semiconductor substrate 402. Formation of the first chip front side interconnect structure 410 can follow.

Figure 30:
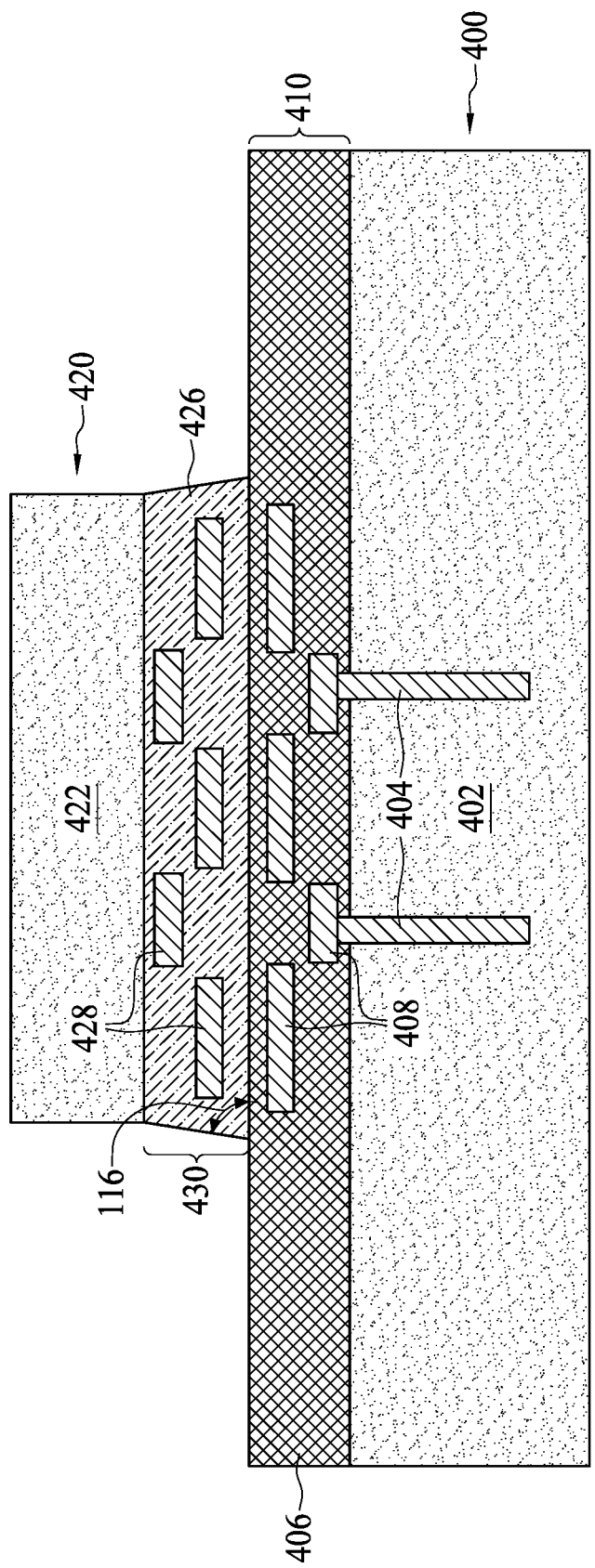

With reference to FIG. 30, a second integrated circuit chip (or more simply, "chip") 420 is bonded to the first chip 400. Much of the discussion of the first chip 100 in FIG. 1 is applicable to the second chip 420 in FIG. 30. One of ordinary skill in the art will readily understand the correspondence of features and discussion between the first chip 100 and the second chip 420, and therefore, some discussion of features of the second chip 420 is omitted herein for brevity. The second chip 420 includes a second semiconductor substrate 422 having a second electrical circuit and has a second chip front side interconnect structure 430 having one or more dielectric layer 426 with a respective metallization pattern 428. The second electrical circuitry may include memory structures, data processing structures, sensors, amplifiers, power distribution, input/output circuitry, or the like. The second chip 420 may undergo processing similar to the processing discussed above with respect to FIGS. 1 through 5.

The second chip 420 is bonded to the first chip 400, such as while the first chip 400 is part of a larger substrate, e.g., a wafer. Hence, FIG. 30 can depict CoW bonding. As illustrated, the second chip front side interconnect structure 430 of the second chip 420 is bonded to the first chip front side interconnect structure 410 of the first chip 400. The bonding may include bonding one dielectric layer 426 of the second chip 420 that is most distal from the second semiconductor substrate 422 to one dielectric layer 406 of the first chip 400 that is most distal from the first semiconductor substrate 402. The bonding may further include bonding a metallization pattern 428 of the second chip 420 that is most distal from the second semiconductor substrate 422 to a metallization pattern 408 of the first chip 400 that is most distal from the first semiconductor substrate 402. Further, the bonding may include bonding a metallization pattern 428 of the second chip 420 to a dielectric layer 406 of the first chip 400, and/or a dielectric layer 426 of the second chip 420 to a metallization pattern 408 of the first chip 400. Hence, bonding can include dielectric-to-dielectric bonding, metal-to-metal bonding, metal-to-dielectric bonding, and/or the like. In some instances, metal-to-metal bonding allows electrical interconnections between the first chip 400 and the second chip 420.

As further shown in FIG. 30, the interior angle 116 of a sidewall of the second chip 420 to the bonding interface between the second chip 420 and the first chip 400 is present in the bonded structure. As previously discussed, the singulation etch process can cause a sidewall of the second chip 420 to be non-vertical, which in turn, can cause the interior angle 116 to be present between that non-vertical sidewall and the bonding interface between the second chip 420 and the first chip 400.

Figure 31:
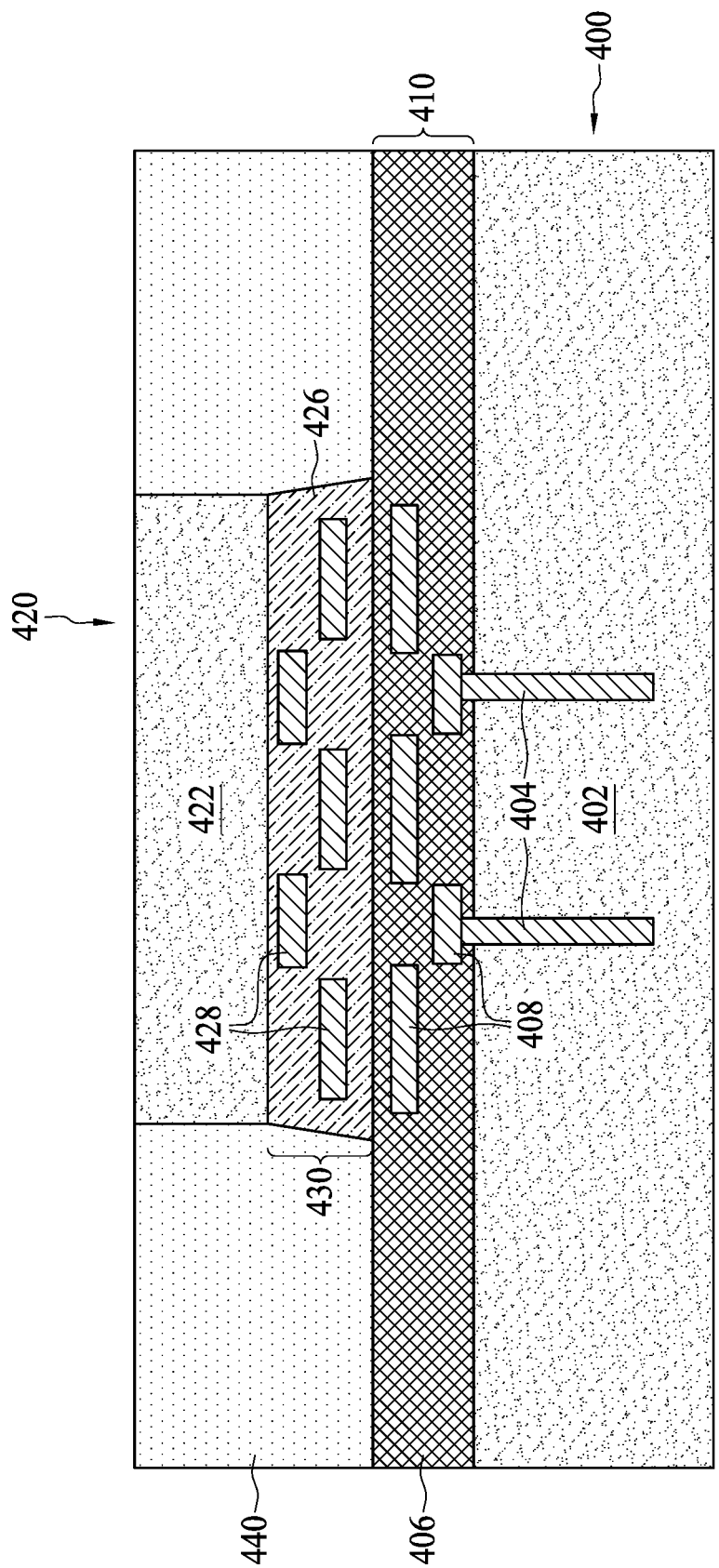

With reference to FIG. 31, the second chip 420 is encapsulated with an encapsulant 440 on the first chip 400, such as while the first chip 400 is part of the larger substrate. The encapsulant 440 can be as discussed above with respect to the encapsulant 160 in FIG. 9.

Figure 32:
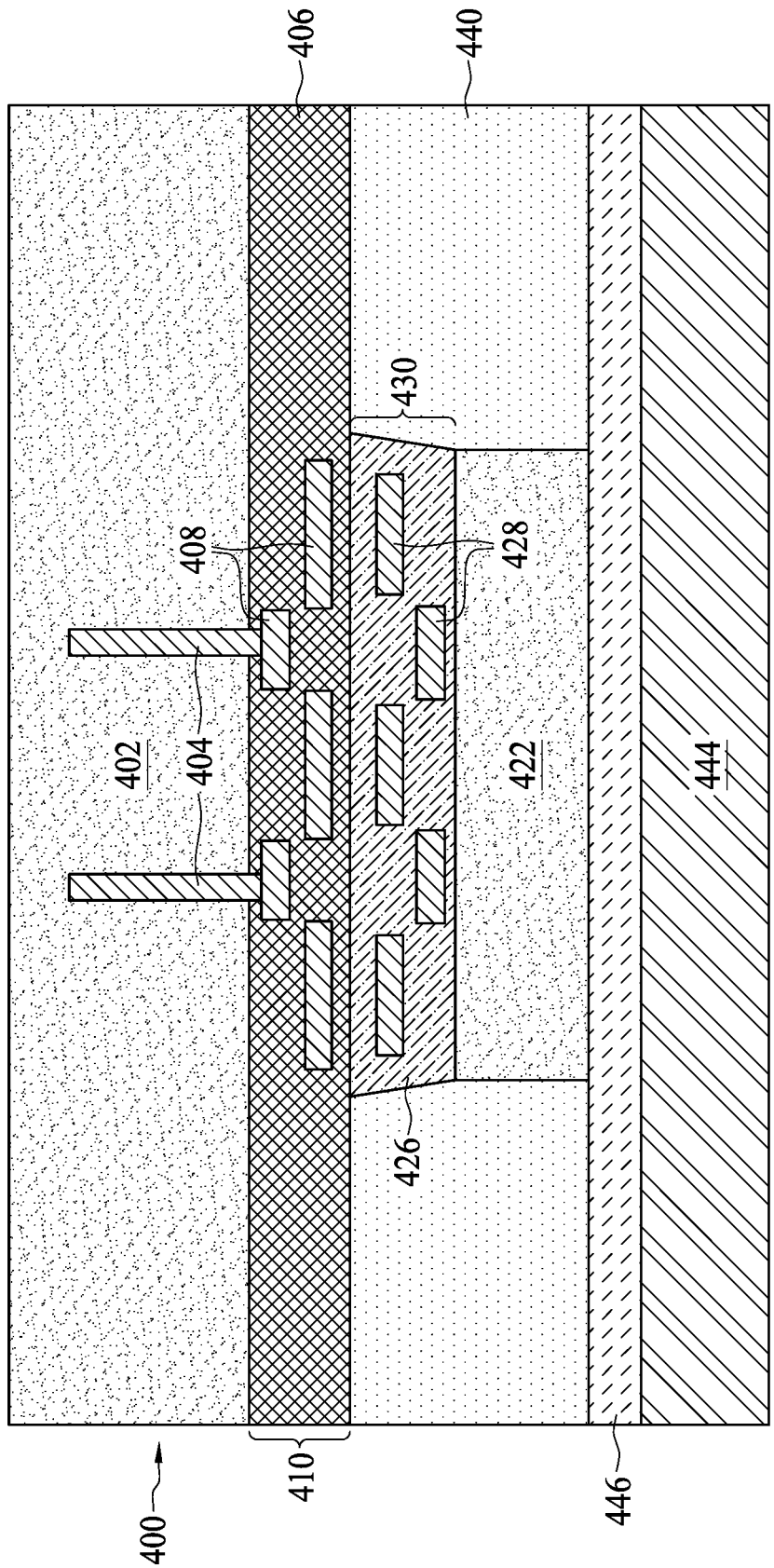

With reference to FIG. 32, the second chip 420, as encapsulated in the encapsulant 440, is adhered to a carrier substrate 444 by a release layer 446. The release layer 446 adheres the back side of the second chip 420 and the encapsulant 440 to the carrier substrate 444. The carrier substrate 444 and release layer 446 may be as discussed with respect to the carrier substrate 112 and release layer 114, respectively, in FIG. 2.

Figure 33:
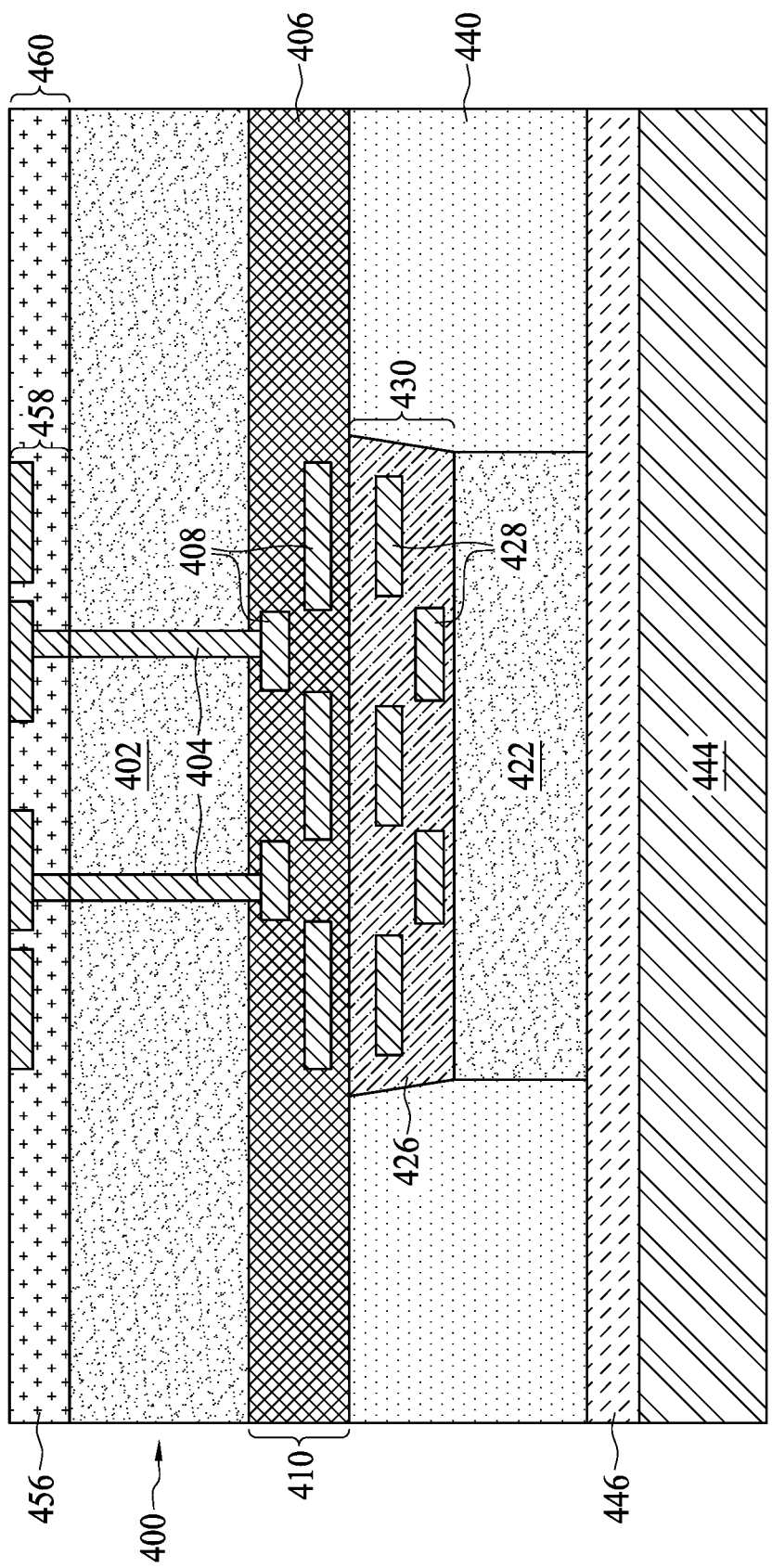

With reference to FIG. 33, once the second chip 420 is adhered to the carrier substrate 444, the first semiconductor substrate 402, as part of the larger substrate, is thinned. The thinning exposes the through vias 404 through the back side of the first semiconductor substrate 402. The thinning process can thin the first semiconductor substrate 402 from the back side of the first semiconductor substrate 402. The thinning process can include a grinding process such as a CMP, an etch-back process, the like, or a combination thereof. In some embodiments, before thinning the first semiconductor substrate 402, the thickness of the first chip 400 (e.g., a combined thickness of the first semiconductor substrate 402 and the first chip front side interconnect structure 410) can be approximately 300 µm or greater, and after thinning the first semiconductor substrate 402, the thickness can be approximately 5 µm or greater, for example, between about 5 µm and about 20 µm.

With further reference to FIG. 33, a first chip back side interconnect structure 460 with one or more dielectric layer 456 and metallization pattern 458 is formed. The metallization patterns 458 of the first chip back side interconnect structure 460 are connected to the through vias 404 to provide electrical connections from the first chip back side interconnect structure 460 to the first chip 400 and the second chip 420. The first chip back side interconnect structure 460 can be formed using processes as discussed above with respect to the first chip stack interconnect structure 170 in FIG. 10.

Figure 34:
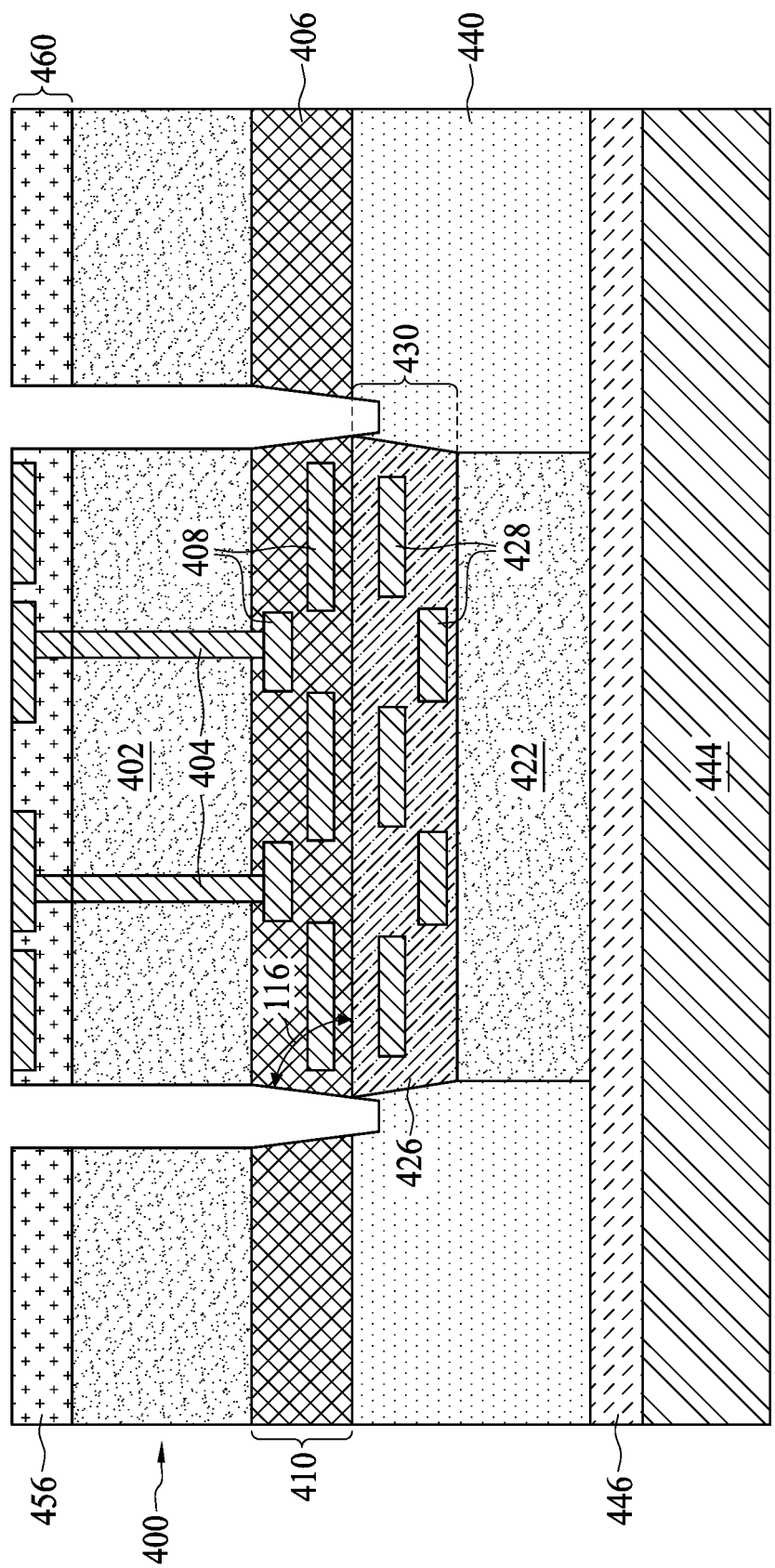

With reference to FIG. 34, while the second chip 420 and encapsulant 440 are adhered to the carrier substrate 444 and the first chip 400 remains part of a larger substrate, an etch singulation process is performed through the back side of the first semiconductor substrate 402 to singulate the chip stack 400/420, from the larger substrate and/or other chips. The etch singulation process can use photolithography and etching techniques. The etch singulation process can include depositing, exposing to light, and developing a photoresist on the first chip back side interconnect structure 460 on the back side of the first semiconductor substrate 402. This process patterns the photoresist on the first chip back side interconnect structure 460 on the back side of the first semiconductor substrate 402. The pattern formed in the photoresist exposes singulation regions outside the periphery of the first chip 400 that are to be etched to thereby singulate the first chip 400 and/or similar chips from the larger substrate. The singulation regions extend beyond a lateral periphery of the second chip 420, as will be discussed in more detail below. An etch process can then be performed through the patterned photoresist. The etch process can be anisotropic, such as a DRIE, an ICP etch, a CCP etch, the like, or a combination thereof. The etch process etches through the singulation regions through the first chip back side interconnect structure 460, the first semiconductor substrate 402, and the first chip front side interconnect structure 410, and into the encapsulant 160. The encapsulant 440 is exposed fully around the first chip 400 due to the alignment of the singulation regions. Various layers may be present on the second semiconductor substrate 132 during the etch process, such as hardmask layer(s), ARC layer(s), the like, or a combination thereof.

The etch process can result in sidewalls of the chip stack 400/420 that are vertical, non-vertical, or a combination thereof. For example, a sidewall of the first chip 400 at and/or proximate the first semiconductor substrate 402 can be vertical, while a sidewall of the first chip front side interconnect structure 410 of the first chip 400 can be non-vertical. As illustrated a sidewall of the first chip front side interconnect structure 410 is non-vertical. An interior angle 116 between the sidewall of the first chip front side interconnect structure 410 and the interface between the first chip front side interconnect structure 410 and the second chip front side interconnect structure 430 is less than 90°, which interior angle 116 may further be between about 89° and about 60°, and more particularly, may be between about 88° and about 80°.

The etch singulation process discussed with respect to FIG. 34 can allow for more flexibility of a layout shape of the first chip 400. For example, including allowing for a rectangular layout shape of the first chip 400, a layout shape of the first chip 400 could be hexagonal, octagonal, circular, ovaloid, another polygonal shape, or the like.

Figure 35:
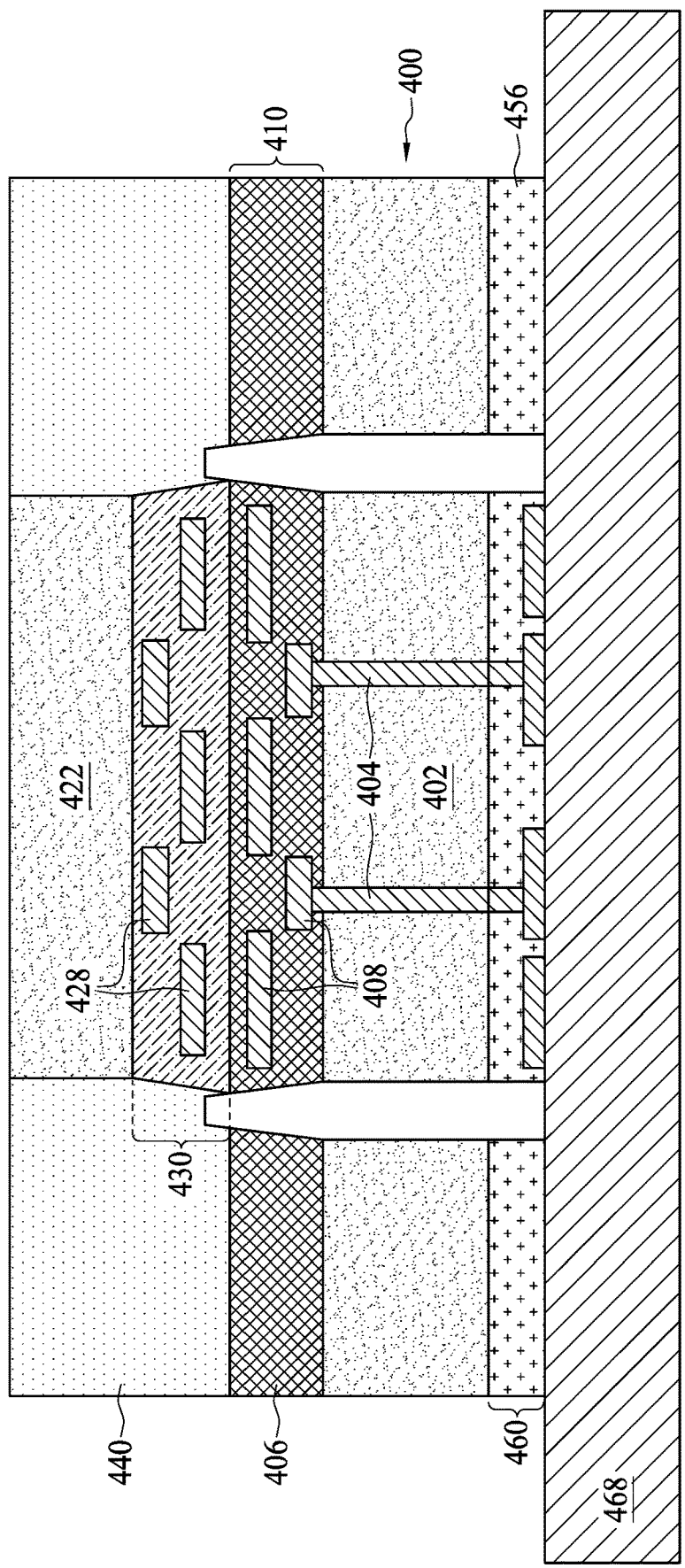

Referring to FIG. 35, the chip stack 400/420, while still adhered to the carrier substrate 444, is flipped over and attached to a dicing tape 468. A carrier substrate detach process is performed to detach the carrier substrate 444 from the first chip back side interconnect structure 460.

Figure 36:
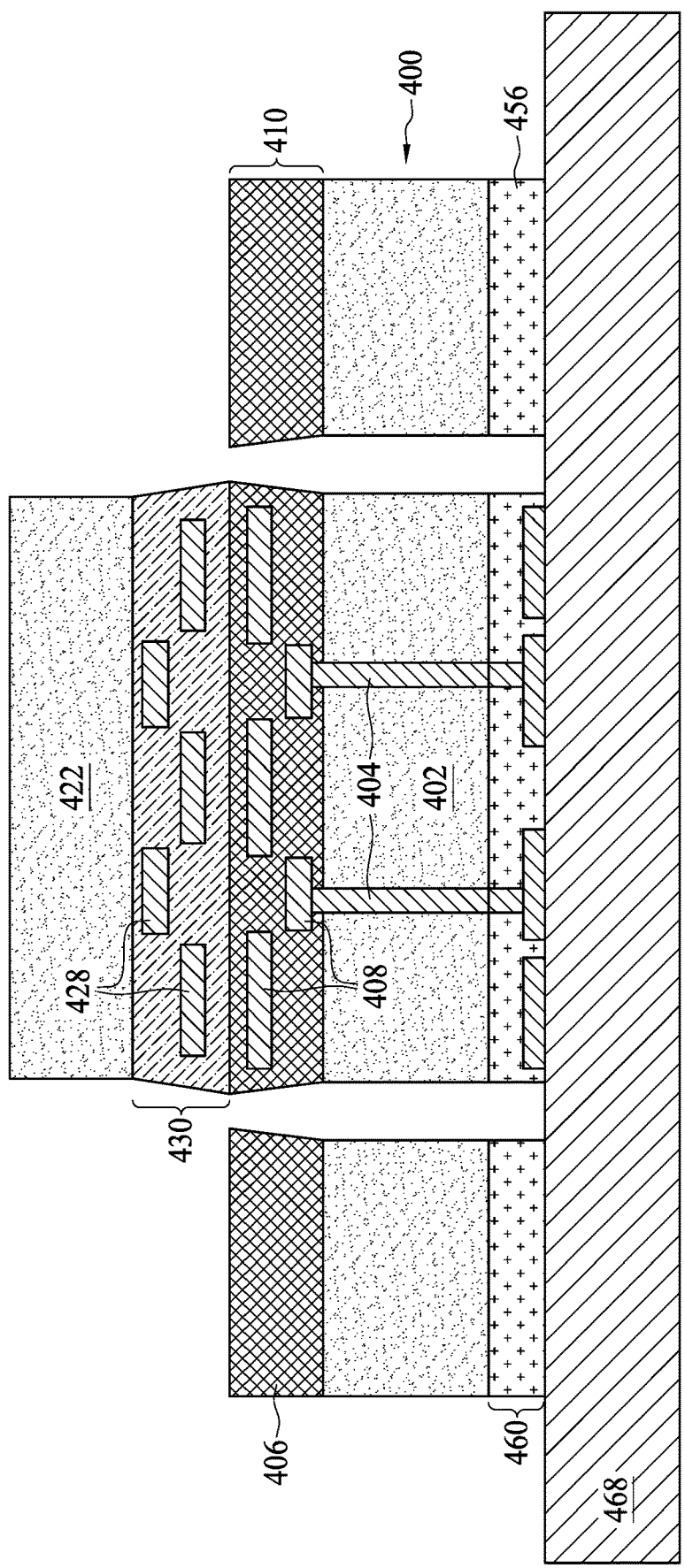

Referring to FIG. 36, the encapsulant 440 is removed from the chip stack 400/420. The encapsulant 440 can be removed by an etch selective to the material of the encapsulant 440. For example, the etch can be an isotropic etch, such as a wet etch. After the removing the encapsulant 440, the chip stack 400/420 and/or other similar chip stacks are singulated.

Various embodiments discussed above have been discussed in the context of using contact bumps, e.g., contact bumps 152, 172, 212, 272, 312, and 352. Other embodiments contemplate other mechanisms by which a chip stack can be attached and electrically connected to a substrate, such as a package substrate. For example, a chip stack can be physically adhered to a package substrate, and wire bonds or optical connections can be used to electrically couple the chip stack to the package substrate.

Some embodiments may achieve advantages. For example, a more reliable CoW bonding interface may be achieved since bonding processes as described herein may avoid particle accumulation at the bonding interface. Further, a reliable die-to-die dielectric gap fill may be achieved with little or without crack or seam void. Also, sizes of one or more chip in a chip stack may be more flexible. Additionally, processing may be at a lower cost.

According to an embodiment, a method includes singulating a first chip and after the singulating the first chip, bonding the first chip to a second chip. The first chip includes a first semiconductor substrate and a first interconnect structure on a front side of the first semiconductor substrate. The singulating the first chip includes etching through a back side of the first semiconductor substrate through the first interconnect structure.

According to another embodiment, a method includes forming a first chip on a unsingulated first wafer. The first chip comprises a first semiconductor substrate that is a portion of the unsingulated first wafer and comprises a first interconnect structure on the first semiconductor substrate. The method further includes singulating the first chip from a remainder of the first wafer, and after the singulating the first chip, bonding the first chip to a second chip. The second chip is on an unsingulated second wafer. The second chip comprises a second semiconductor substrate that is a portion of the unsingulated second wafer and comprises a second interconnect structure on the second semiconductor substrate. The first interconnect structure is bonded to the second interconnect structure. After the bonding, an exterior sidewall of the first interconnect structure forming meets a bonding interface between the first chip and the second chip at an angle of less than 90°.

According to a further embodiment, a structure includes a first chip and a second chip bonded to the first chip. The first chip comprises a first semiconductor substrate and a first interconnect structure on front side of the first semiconductor substrate. The second chip comprises a second semiconductor substrate and a second interconnect structure on front side of the second semiconductor substrate. An exterior sidewall of the first chip at a bonding interface between the first chip and the second chip meets the bonding interface at an interior angle of less than 90°.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
receiving a semiconductor wafer with a front side and a back side, the back side being a semiconductor substrate and the front side being a first interconnect structure;
etching the back side of the semiconductor wafer and through the semiconductor substrate to expose a release layer, the etching forming a first interior angle between a first sidewall of the first interconnect structure and an exterior surface of the first interconnect structure of between about 89° and about 60°;
removing the release layer from the semiconductor wafer;
bonding the front side to a dielectric material located over a second semiconductor wafer, wherein after the bonding the sidewall of the first interconnect structure meets a bonding interface between a first dielectric layer of the first interconnect structure and the dielectric material at a second angle that is equal to the first interior angle; and
encapsulating the first interconnect structure with an encapsulant.

2. The method of claim 1, further comprising thinning the semiconductor substrate prior to the etching the back side of the semiconductor wafer.

3. The method of claim 2, wherein after the thinning the semiconductor substrate the semiconductor wafer has a thickness between about 5 µm and about 20 µm.

4. The method of claim 1, wherein after the etching the back side of the semiconductor wafer a sidewall of the semiconductor wafer proximate the back side is vertical and a sidewall of a first chip proximate the front side interconnect structure is non-vertical.

5. The method of claim 1, wherein the first interior angle is between about 88° and about 80°.

6. The method of claim 1, further comprising forming vias through the second semiconductor wafer after the encapsulating the first interconnect structure.

7. A method of manufacturing a semiconductor device, the method comprising:
singulating a semiconductor substrate and a first interconnect structure to form a first angle between a sidewall of the first interconnect structure and an exterior surface of the first interconnect structure of between about 89° and about 60°; and
after the singulating the semiconductor substrate and the first interconnect structure, bonding a first dielectric layer of the first interconnect structure to a second dielectric layer of a second interconnect structure, the second interconnect structure being located over an unsingulated wafer, wherein after the bonding the sidewall of the first interconnect structure meets a bonding interface between the first dielectric layer and the second dielectric layer at a second angle that is equal to the first angle.

8. The method of claim 7, further comprising thinning the semiconductor substrate prior to the singulating the semiconductor substrate.

9. The method of claim 8, further comprising:
encapsulating the semiconductor substrate; and
after the encapsulating, forming conductive vias at least partially through the second interconnect structure.

10. The method of claim 8, further comprising:
encapsulating the semiconductor substrate; and
after the encapsulating, forming conductive vias at least partially through the first interconnect structure.

11. The method of claim 10, further comprising electrically connecting a third interconnect structure to the conductive vias.

12. The method of claim 11, further comprising encapsulating the third interconnect structure.

13. The method of claim 12, further comprising forming a fourth interconnect structure after the encapsulating the third interconnect structure.

14. The method of claim 13, further comprising forming external connectors on the fourth interconnect structure after the forming the fourth interconnect structure.

15. A method of manufacturing a semiconductor device, the method comprising:
exposing a release layer by removing portions of a semiconductor wafer and a first interconnect structure, wherein after the exposing the first interconnect structure has a first interior angle between a first sidewall of the first interconnect structure and an exterior surface of the first interconnect structure of between about 89° and about 60°;
removing the first interconnect structure from the release layer; and
bonding a first dielectric material of the first interconnect structure with a second dielectric material of a second interconnect structure, wherein during the bonding the second dielectric material is located over an unsingulated semiconductor wafer, and wherein after the bonding the first sidewall of the first interconnect structure meets a bonding interface between the first dielectric material and the second dielectric material at a second angle that is equal to the first angle.

16. The method of claim 15, wherein after the exposing the release layer, a sidewall of the semiconductor wafer is vertical and a sidewall of the first interconnect structure is non-vertical.

17. The method of claim 15, further comprising:
encapsulating the semiconductor wafer; and
forming conductive vias through the semiconductor wafer after the encapsulating the semiconductor wafer.

18. The method of claim 17, bonding a semiconductor die to the conductive vias.

19. The method of claim 18, further comprising encapsulating the semiconductor die after the bonding the semiconductor die.

20. The method of claim 15, further comprising:
encapsulating the semiconductor wafer; and
after the encapsulating the semiconductor wafer, forming conductive vias through a second semiconductor wafer adjacent to the second interconnect structure.

* * * * *